United States Patent [19]
Tokura et al.

[11] Patent Number: 6,015,737
[45] Date of Patent: *Jan. 18, 2000

[54] PRODUCTION METHOD OF A VERTICAL TYPE MOSFET

[75] Inventors: Norihito Tokura; Shigeki Takahashi, both of Okazaki; Tsuyoshi Yamamoto, Chiryu; Mitsuhiro Kataoka, Kariya, all of Japan

[73] Assignee: Denso Corporation, Kariya, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/515,176

[22] Filed: Aug. 15, 1995

Related U.S. Application Data

[62] Continuation-in-part of application No. 08/413,410, Mar. 30, 1995, Pat. No. 5,776,812, and application No. 08/030,338, filed as application No. PCT/JP92/00929, Jul. 22, 1992, Pat. No. 5,460,985.

[30] Foreign Application Priority Data

Jul. 26, 1991 [JP] Japan .................................. 3-187602
Mar. 31, 1994 [JP] Japan .................................. 6-62448

[51] Int. Cl.$^7$ .................................................. H01L 21/336
[52] U.S. Cl. ........................ 438/270; 438/271; 438/589; 438/138
[58] Field of Search ....................... 437/40 DM, 41 DM, 437/29, 68, 913; 148/DIG. 115, DIG. 126; 438/270, 271, 444, 589, 268, 138

[56] References Cited

U.S. PATENT DOCUMENTS

| 3,901,737 | 8/1975 | Dash ...................................... 438/421 |
| 4,001,465 | 1/1977 | Graul et al. ............................. 438/444 |
| 4,148,047 | 4/1979 | Hendrickson ............................ 257/332 |
| 4,217,599 | 8/1980 | Sato et al. ............................... 257/327 |
| 4,261,761 | 4/1981 | Sato et al. ............................... 438/270 |
| 4,364,073 | 12/1982 | Becke et al. ............................ 257/142 |
| 4,364,074 | 12/1982 | Garnache et al. ...................... 438/271 |

(List continued on next page.)

FOREIGN PATENT DOCUMENTS 0 345 380    12/1989   European Pat. Off. .
0 550 770 A1  7/1993   European Pat. Off. .

(List continued on next page.)

OTHER PUBLICATIONS

Kishino and Koyanagi, "Physics of VLSI Device", Jul. 1986, p. 145.
Elie S. Ammar, et al., "UMOS Transistor on (110) Silicon", IEEE Transactions on Electron Devices, vol. ED–27, May, 1980, pp. 907–914.

(List continued on next page.)

Primary Examiner—Michael Trinh
Attorney, Agent, or Firm—Pillsbury Madison & Sutro LLP

[57] ABSTRACT

A vertical type power MOSFET remarkably reduces its ON-resistance per area. A substantial groove formation in which a gate structure is constituted is performed beforehand utilizing the LOCOS method before the formation of a p-type base layer and an n$^+$-type source layer. The p-type base layer and the n$^+$-type source layer are then formed by double diffusion in a manner of self-alignment with respect to a LOCOS oxide film, simultaneously with which channels are set at sidewall portions of the LOCOS oxide film. Thereafter the LOCOS oxide film is removed to provide a U-groove so as to constitute the gate structure. Namely, the channels are set by the double diffusion of the manner of self-alignment with respect to the LOCOS oxide film, so that the channels, which are set at the sidewall portions at both sides of the groove, provide a structure of exact bilateral symmetry, there is no positional deviation of the U-groove with respect to the base layer end, and the length of the bottom face of the U-groove can be made minimally short. Therefore, the unit cell size is greatly reduced, and the ON-resistance per area is greatly decreased.

27 Claims, 10 Drawing Sheets

U.S. PATENT DOCUMENTS

| | | | |
|---|---|---|---|
| 4,412,378 | 11/1983 | Shinada | 438/370 |
| 4,503,449 | 3/1985 | David et al. | 257/330 |
| 4,507,849 | 4/1985 | Shinozaki | 438/430 |
| 4,824,795 | 4/1989 | Blanchard | 438/413 |
| 4,879,254 | 11/1989 | Tsuzuki et al. | 438/273 |
| 4,992,390 | 2/1991 | Chang | 438/270 |
| 5,385,852 | 1/1995 | Oppermann et al. | 438/270 |
| 5,399,515 | 3/1995 | Davis et al. | 438/270 |
| 5,460,985 | 10/1995 | Tokura et al. | 437/913 |
| 5,470,770 | 11/1995 | Takahashi et al. | 437/29 |
| 5,532,179 | 7/1996 | Chang et al. | 438/270 |

FOREIGN PATENT DOCUMENTS

| | | |
|---|---|---|
| 2 513 016 | 3/1983 | France . |
| 3427293 A1 | 2/1985 | Germany . |
| 4300806 C1 | 12/1993 | Germany . |
| 53-16581 | 2/1978 | Japan . |
| 54-91187 | 7/1979 | Japan . |
| 54-146584 | 11/1979 | Japan . |
| 55-48968 | 4/1980 | Japan . |
| 56-96865 | 8/1981 | Japan . |
| 56-150870 | 11/1981 | Japan . |
| 57-18365 | 1/1982 | Japan . |
| 58-58771 | 4/1983 | Japan . |
| 58-93275 | 6/1983 | Japan . |
| 58-166759 | 10/1983 | Japan . |
| 58-215053 | 12/1983 | Japan . |
| 59-008375 | 1/1984 | Japan . |
| 59-8374 | 1/1984 | Japan . |
| 59-8375 | 11/1984 | Japan ............ 148/DIG. 126 |
| 60-28271 | 2/1985 | Japan . |
| 60-175457 | 9/1985 | Japan . |
| 61-141151 | 6/1986 | Japan . |
| 61-199666 | 9/1986 | Japan . |
| 62-12167 | 1/1987 | Japan . |
| 62-46569 | 2/1987 | Japan . |
| 63-94687 | 4/1988 | Japan . |
| 63-250852 | 10/1988 | Japan . |
| 63-254769 | 10/1988 | Japan . |
| 63-266882 | 11/1988 | Japan . |
| 1-189172 | 7/1989 | Japan . |
| 1-192174 | 8/1989 | Japan . |
| 1-310576 | 12/1989 | Japan . |
| 2-86136 | 3/1990 | Japan . |
| 2-86171 | 3/1990 | Japan . |
| 2-262375 | 10/1990 | Japan . |
| 4-58532 | 2/1992 | Japan . |
| 4-92473 | 3/1992 | Japan . |
| WO-93/03502 | 2/1993 | WIPO . |

OTHER PUBLICATIONS

Stanley Wolf, et al., Silicon Processing for the VLSI ERA, vol. 1: Press Technology, 1986, pp. 539–583.

Gill, "A Simple Technique for Monitoring Undercutting in Plasma Etching", Solid–State Electronics, vol. 23, 1980, p. 995.

Lee, et al., "Silicon Doping Effects in Reactive Plasma Etching" Journal of Vacuum Science & Technology B4(2), Mar./Apr., 1986, pp. 468–475.

Hideo Sakai, et al., "Methods to Improve the Surface Planarityof Locally Oxidized Silicon Devices", J. Electrochem. Soc.: Solid–State Science & Technology, Feb. 1997, pp. 318–320.

UEDA, et al., "A New Vertical Power MOSFET Structure with Extremely Reduced On–Resistance", IEEE Transactions of Electron Devices, vol. Ed–32, No. 1, Jan., 1985.

Sze, VLSI Technology, 2nd Ed., 1988, pp. 100–110.

Nikkei Electronics No. 395, May, 1986, pp. 165–188. (See Appln. p. 1).

Norihito Tokura et al, "Concave DMOSFET: A New Super Low Resistance Power MOSFET", Jpn. J. Appl. Phys. vol. 34 Part 1, No. 2B, Feb. 1995, pp. 903–908.

Norihito Tokura et al, "Concave DMOSFET: A new Super Low Resistance Power MOSFET", Jpn. Society of Applied Phys., Aug. 23–26, 1994, pp. 763–765.

Norihito Tokura et al, "The DMOS Consisting of Channel Region Defined by LOCOS . . . Power MOSFET", IEEE May 18–20, 1993, pp. 135–140.

"Developing Power MOSFET of 50m . . . ", Nikkei Electronics, 1994. 9. 5, (No. 616) pp. 15–16.

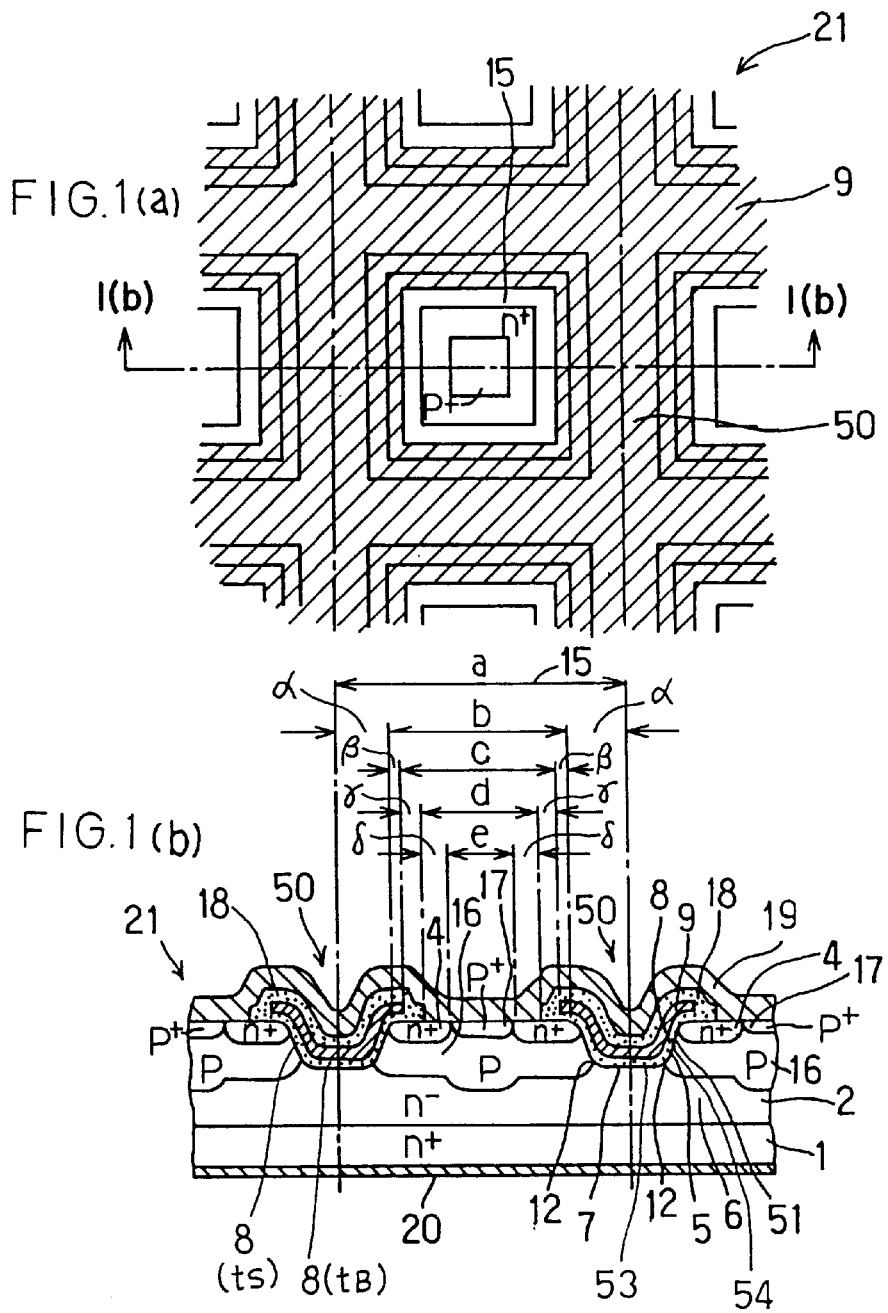
FIG.1(a)
FIG.1(b)
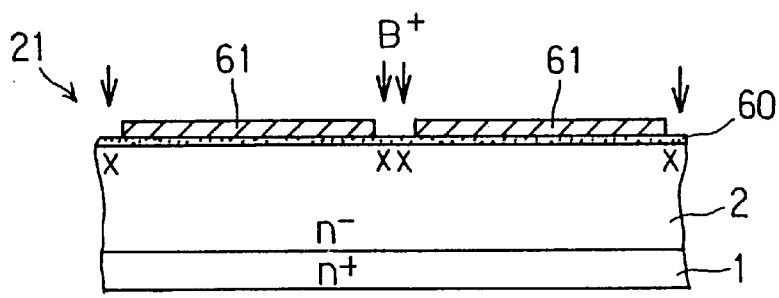
FIG.2

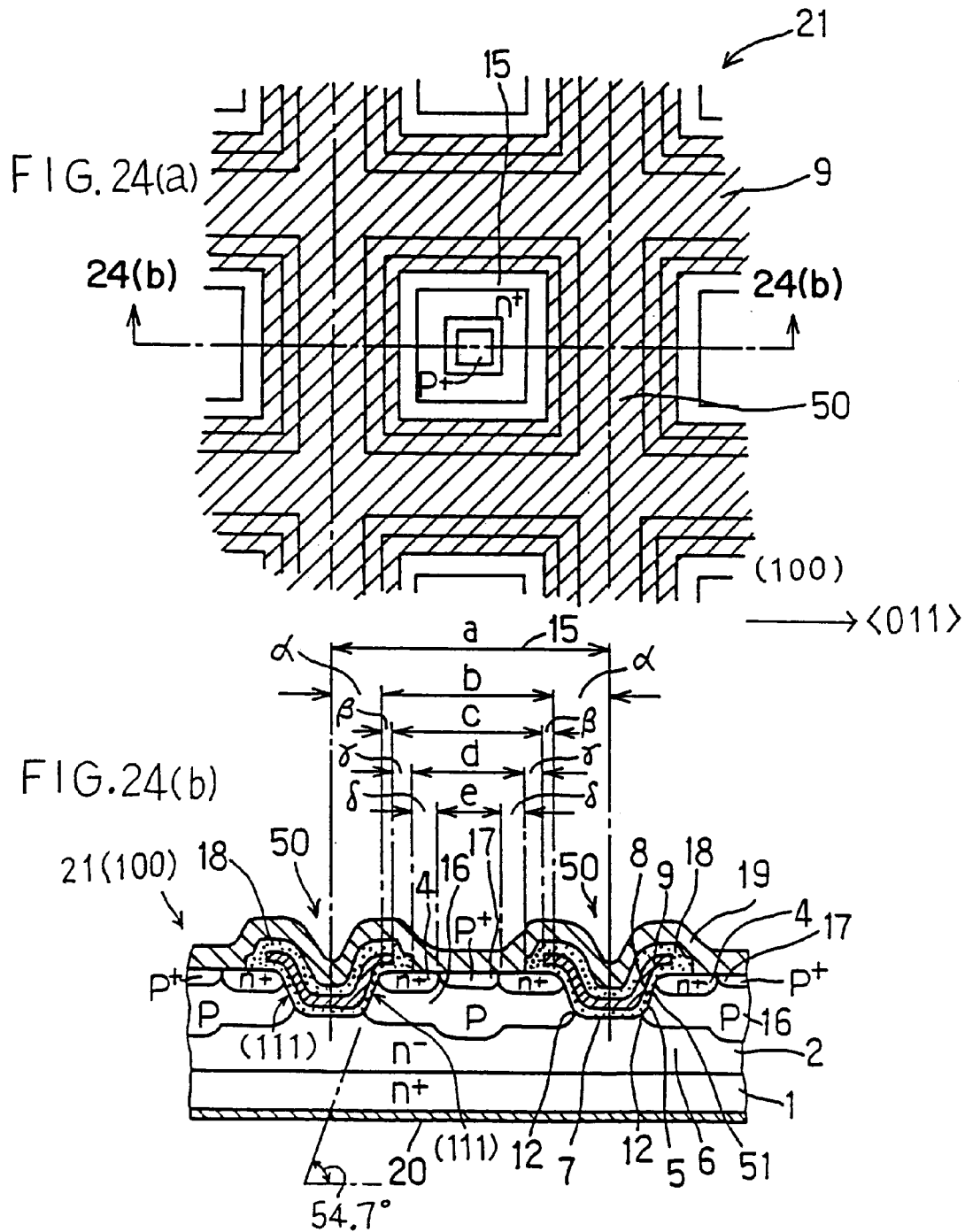

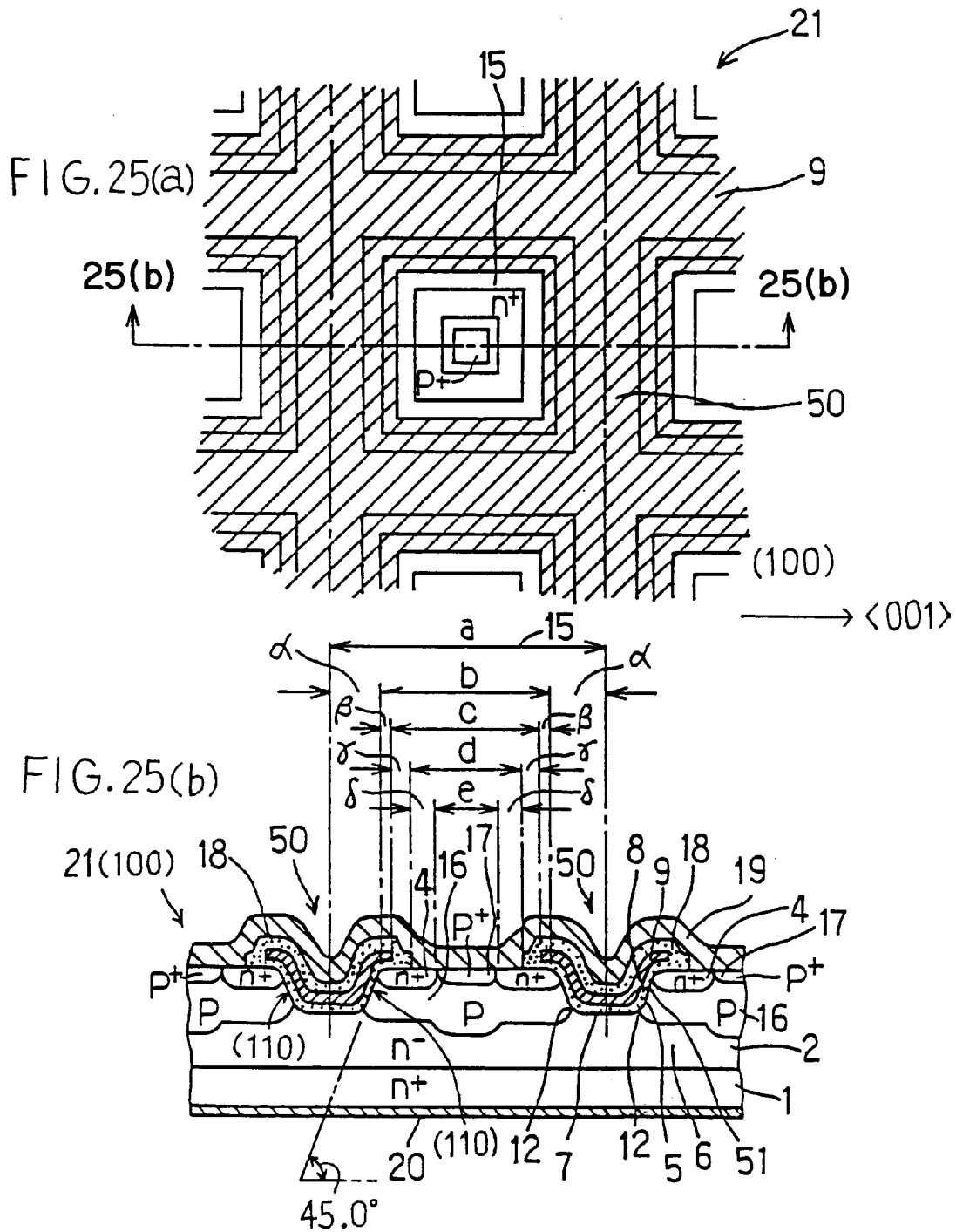

PRODUCTION METHOD OF A VERTICAL TYPE MOSFET

CROSS REFERENCE TO RELATED APPLICATIONS

This is a continuation-in-part of U.S. application Ser. No. 08/413,410 filed on Mar. 30, 1995, U.S. Pat. No. 5,776,812, and is a continuation-in-part application of U.S. application Ser. No. 08/030,338 filed on Mar. 25, 1993, U.S. Pat. No. 5,460,985, which is a national phase application of Patent Cooperation Treaty Application PCT/JP92/00929 filed on Jul. 22, 1992, WO93/03502, and claiming priority of the Japanese National Patent Application No. 3-187602 filed on Jul. 26, 1991.

BACKGROUND OF THE INVENTION

1. Technical Field

The present invention relates to a vertical type MOSFET (Metal Oxide Semiconductor Field Effect Transistor) to be used as a semiconductor device for electric power, which is preferable in the case of adoption as MOSIC and the like in which an elemental article thereof or the semiconductor device for electric power is incorporated.

2. Background Art

The vertical type power MOSFET has many features such that it has excellent frequency characteristics, has a fast switching velocity, can be driven at low electric power and the like, so that it has recently been used in many industrial fields. For example, in "Nikkei Electronics" published by Nikkei-McGraw-Hill, Inc. on May 19, 1986, pp. 165–188, it is described that the focus of development of the power MOSFET is in migrating to low voltage resistant articles and high voltage resistant articles. Further, it is described in this literature that the ON-resistance of a power MOSFET chip having a voltage resistance not more than 100 V has become low up to a level of 10 mΩ, and it is described as a reason thereof that the channel width per area has been able to be made large by utilizing the fine processing of LSI in the production of the power MOSFET, or by improving the shape of its cell. In addition, in this literature, the description is made using the vertical type power MOSFET as a main topic in which a DMOS type (double diffusion type) cell which is in the main current is used. The reason is that the DMOS type is fabricated by the planar process characterized in that the flat main surface of a silicon wafer is exactly used for a channel portion, so that it has advantages in production of a good yield and a cheap cost.

On the other hand, in accordance with popularization of the vertical type power MOSFET, the realization of low loss and low cost is further demanded, however, the reduction in the ON-resistance by the fine processing or the improvement in the shape of the cell has arrived at the limit. For example, according to the official gazette of Japanese Patent Application Laid-open No. Sho 63-266882 (1988), it has been known that the DMOS type has a local minimum point in which the ON-resistance does not further decrease even when the size of the unit cell is made small by fine processing, and a major cause thereof is the increase in the JFET resistance which constitutes a component of the ON-resistance. In addition, with respect to the DMOS type, as shown in the official gazette of Japanese Patent Application Laid-open No. Hei 2-86136 (1990), the size of the unit cell with which the ON-resistance provides the local minimum point is in the vicinity of 15 μm under the present fine processing technique.

In order to break through this limit, various structures have been proposed. The common feature among them is a structure in which a groove is formed on the device surface, and channel portions are formed at side faces of the groove, and owing to this structure, the above-mentioned JFET resistance can be greatly decreased. Further, in the structure in which the channel portions are formed at the side faces of the groove, the increase in the JFET resistance can be neglected even when the unit cell size is made small, so that there is no limit that the ON-resistance provides the local minimum point with respect to the reduction in the unit cell size as described in the official gazette of the Japanese Patent Application Laid-open No. Sho 63-266882 (1988), and it can be made small to the limit of the fine processing breaking though 15 μm.

The structure, in which the channel portions are formed at the side faces of the groove, is called the R (Rectangular)-MOS device or the U (U-shaped)-MOS device according to its shape. The structure shown in the official gazette of Japanese Patent Application Laid-open No. Sho 59-8743 (1984) is an example of the R-MOS device, which is a structure alternatively called the trench gate type in which a vertical groove is formed at the device surface by means of the anisotropic dry etching method, and channels and a gate are formed at sidewall portions of this groove, and this can completely extinguish the JFET resistance component. On the other hand, the structure shown in the official gazette of Japanese Patent Application Laid-open No. Hei 2-86171 (1990) is an example of the U-MOS in which the anisotropic wet etching of silicon or the LOCOS oxidation (Local Oxidation of Silicon) method is used as a method for processing the channel portion into the U-groove shape, and this can also greatly reduce the JFET resistance component.

Typical conventional examples of the vertical type power MOSFET in which the channel portions are formed at the side faces of the groove are shown in FIG. 14 (R-MOS) and FIG. 15 (U-MOS).

At first, the R-MOS device shown in FIG. 14 will be explained. In this vertical type power MOSFET, at the surface layer porion of an epitaxial layer 2 comprising an n$^-$-type layer provided on a main face of a semiconductor substrate 1 comprising an n$^+$-type silicon, a p-type diffusion layer and an n$^+$-type diffusion layer are successively formed by ion implantation and thermal diffusion. Next, in order to allow parts of these p-type diffusion layer and n$^+$-type diffusion layer to remain as a p-type base layer 16 and an n$^+$-type source layer 4 respectively, the reactive ion etching method is used to perform etching until penetration though the p-type diffusion layer in the vertical direction with respect to the silicon substrate is achieved, so as to form a trench groove 50. A gate oxide film 8 is formed on an inner wall 51 of this trench groove 50, on which a gate electrode 9 is formed. Thus channels 5 are formed at sidewall portions of the inner wall 51, and the channel length is determined by a thickness of the p-type base layer 16. The ohmic contact is made for a source electrode 19 with the n$^+$-type source layer 4, and for a drain electrode 20 with the back face of the semiconductor substrate 1, respectively.

In this R-MOS device, the ON-resistance between the drain and the source thereof is approximately the same as a sum of a channel resistance and a resistance of the n$^-$-type drain layer 6, in which there is no JFET resistance which has been a problem in the above-mentioned DMOS type. Therefore, the ON-resistance monotonously decreases in accordance with the reduction in the unit cell size a", the reduction can be made up to 5 to 6 μm which is the limit in the present fine processing, and the ON-resistance per area can be greatly reduced as compared with the DMOS type.

However, the R-MOS device has drawbacks in that the yield and the reliability are low. The cause is that the trench groove 50 is formed by the reactive ion etching method, and therefore the flatness of the sidewall surface of the inner wall 51 is bad and produces many defects, and the film quality of the gate oxide film 8, which is formed by oxidizing the surface thereof, is bad. Insulation inferiority of the gate oxide film, a decrease in the mobility due to the defect of the interface of the channel portion, and a change in the threshold voltage also take place. As described-above, the structure of the R-MOS device has the advantage of greatly reducing the ON-resistance per area, but there are problems of high cost resulting from the low yield, and a problem of difficulty to ensure the reliability due to the bad stability of the gate oxide film and the channel portion.

On the contrary, in the U-MOS device shown in FIG. 15, the anisotropic wet etching or the LOCOS oxidation method is used as the step for forming the U-groove instead of the reactive ion etching, so that the flatness of the sidewall surface is good, a U-groove 50 having an inner wall 51 with less defect can be formed, and so that the film quality of a gate oxide film 8 formed by oxidizing the surface thereof is also good. As a result, no insulation inferiority occurs, the characteristics of the channel portion can be made stable and the like, and a vertical type power MOSFET having a high yield and reliability can be obtained.

Fabrication steps for this U-MOS device will be explained in accordance with FIG. 16 to FIG. 19 and FIG. 15. In this vertical type power MOSFET, as shown in FIG. 16, using a mask of an insulation film 22 partially formed with a unit cell size a' of a cell on the main surface of a wafer 21 provided with an epitaxial layer 2 comprising an n⁻-type layer provided on a main face of a semiconductor substrate 1 comprising n⁺-type silicon, boron is doubly diffused by selective ion implantation and thermal diffusion, so as to form a p-type diffusion layer 23 and a p⁺-type contact region 17. Next, after removing the insulation film 22, as shown in FIG. 17, using a mask of an insulation film 24 partially formed on the main surface of the wafer 21, phosphorus is diffused so as to form an n⁺-type diffusion layer 25 to overlap over p-type diffusion layers 23 of adjacent cells 15.

Next, after removing the insulation film 24, as shown in FIG. 18, using a mask of an insulation film 26 partially formed on the main surface of the wafer 21, the U-groove 50 is formed by the anisotropic etching or the LOCOS oxidation method. By the formation of this U-groove 50, peripheral edge portions of the adjacent p-type diffusion layers 23 and the central portion of the n⁺-type diffusion layer 25 are removed, so as to form a p-type base layer 16 and an n⁺-type source layer 4 separated by the U-groove 50 for every unit cell having a unit cell size of a'.

Next, after removing the insulation film 26, as shown in FIG. 19, a gate oxide film 8 is formed on the surface of the U-groove 50, and a gate electrode 9 comprising polysilicon is formed on this gate oxide film 8. Next, as shown in FIG. 15, an interlayer insulation film 18 is formed on the main surface of the wafer 21 so as to cover the gate oxide film 8 and the gate electrode 9, and the interlayer insulation film 18 is subjected to opening formation in order to expose parts of the p⁺-type base contact layer 17 and the n⁺-type source layer 4. A source electrode 19, which makes ohmic contact with the p⁺-type base contact layer 17 and the n⁺-type source layer 4, is formed on the main surface of the wafer 21. Further, a drain electrode 20 which makes ohmic contact with the back face of the semiconductor substrate 1 is formed, and the vertical type power MOSFET of the U-MOS structure is completed.

This U-MOS device shown in FIG. 15 has the feature that the yield and the reliability are high in a degree equivalent to the DMOS type, which is extremely excellent in this point as compared with the R-MOS device. This is due to the fact that the U-groove 50 is formed by the wet etching of silicon or the LOCOS oxidation method, thereby the flatness of its inner wall 51 is good with less defect, and the film quality of the gate oxide film 8 formed by oxidizing the surface thereof is also good, and it becomes difficult to cause the insulation inferiority of the gate oxide film and the characteristic change of the channel portion.

The ON-resistance between the drain and the source of the U-MOS is approximately the same as a sum of a channel resistance and a resistance of the n⁻-type drain layer 6 in the same manner as the above-mentioned R-MOS, and the JFET resistance of a JFET portion 7 is sufficiently small. Thus, in the same manner as in the above-mentioned R-MOS device, the ON-resistance decreases monotonously in accordance with the reduction in the unit cell size a', however, it can be only made slightly smaller than about 15 μm of the DMOS type within the limit of the present fine processing, and cannot be made small into 5 to 6 μm of the R-MOS type. However, since the JFET resistance is sufficiently small, the ON-resistance per area is an intermediate value between those of the R-MOS type and the DMOS type. As described above, the U-MOS has such a structure in which the feature of the low ON-resistance of the R-MOS is partially inherited while maintaining the high production yield and the high reliability of the DMOS.

In order to reduce the ON-resistance of the U-MOS to be equivalent to the R-MOS, it is necessary and indispensable to reduce the unit cell size a'. However, in the production method of the U-MOS shown in FIGS. 16 to 19 and FIG. 15, the reduction in the unit cell size a' is difficult. The reason thereof will be explained hereinafter.

At first, it will be explained in detail what determines the unit cell size of the U-MOS device.

In FIG. 15, the sizes of indicated portions have relations as follows.

$$a'=b'+2\alpha'$$
$$b'=c'+2\beta'$$
$$c'=d'+2\gamma' \quad (1)$$
$$d'=e'+2\delta'$$

Wherein, a' is a unit cell size, b' is a distance between upper ends of two adjacent U-grooves, c' is a distance between adjacent gate electrodes, d' is a size of a contact hole, and e' is a size of a portion of the base contact layer 17 exposed to the surface. In addition, α' is a plane distance between the center and the upper end of the U-groove 50, β' is a plane distance between the upper end of the U-groove 50 and the end of the gate electrode 9, γ' is a plane distance between the end of the gate electrode 9 and the end of the contact hole, and δ' is a plane distance between the end of the contact hole and the end of the portion of the base contact layer 17 exposed to the surface.

In this case, in the present fine processing level, the adjustment accuracy of the mask is about 0.5 to 1 μm, and also considering the size accuracy in the etching processing and the like, each value in the above-mentioned formulae (1) takes, for example, the following value.

$$\beta'=1[\mu m],\ \gamma'=1.5[\mu m],\ \delta'=1[\mu m],\ b'=8.5[\mu m],\ c'=6.5[\mu m],\ d'=3.5\ [\mu m],\ e'=1.5[\mu m] \quad (2)$$

According to the formulae (1) and (2), the unit cell size a' is $$a'=b'+2\alpha'=8.5+2\alpha'[\mu m] \quad (3)$$

wherein in order to reduce the unit cell size a', the value of the plane distance a' between the center and the upper end of the U-groove 50 is key.

According to FIGS. 16 to 18, it is understood that the size of α' is determined by the length of the bottom side and the processing accuracy of the U-groove 50, and the adjustment accuracy of the insulation film 26 (the mask for forming the U-groove) with respect to the p-type diffusion layer 23. FIG. 20 is a cross-sectional view of an important part including the U-groove 50 when a center line $CL_1$ between the two adjacent p-type diffusion layers 23 overlaps a center line $CL_2$ between the two adjacent insulation films 26, which corresponds to a case in which there is no mask deviation. In this case, a' is given by the following formula (4).

$$\alpha'=\alpha'1+\alpha'2+\alpha'3 \quad (4)$$

However, α'1 is ½ of a length with which the bottom side portion of the U-groove 50 contacts with the n⁻-type drain layer 6, α'2 is a length with which the bottom side portion of the U-groove 50 contacts with the p-type base layer 16, and α'3 is a length of projection of the sidewall portion of the U-groove 50 onto the main surface of the wafer 21.

In this case, the right and left α'2s are approximately equal in FIG. 20. However, in fact, due to the presence of the deviation of the mask adjustment, the right and left α'2s are different, so that it is necessary that α'2 in each of the items in the formula (4) is set to be about 1.5 μm. The reason thereof is that when mask adjustment of the insulation film 26 is worst, on account of the mask adjustment accuracy possible under the present circumstances, as shown in FIG. 21, with respect to the center line $CL_1$ between the two adjacent p-type diffusion layers 23, the center line $CL_2$ between the two adjacent insulation films 26 generates a positional deviation (for example, 1 μm) in the right direction. In order to prevent an electric field concentration at the edge portion 12 so as to avoid the inconvenience resulting from a dielectric breakdown of the gate portion even when such positional deviation takes place, thus allowing the edge portion 12 at the groove bottom of the U-groove 50 not to be exposed to the n⁻-type drain layer 6 but to be positioned in the p-type base layer 16, it is necessary to make a design in which this positional deviation is taken into account. Therefore, the following formula (5) must be necessarily established with respect to lengths α'21 and α'22 with which the bottom side portions of the U-groove 50 contact with the p-type base layers 16.

$$0<\alpha'21, \alpha'22 \quad (5)$$

In addition, with respect to α'1 and α'3, both of them are about 0.75 μm in the present fine processing level, so that α' takes the following value according to the formula (4).

$$\alpha'=0.75+1.5+0.75=3[\mu m] \quad (6)$$

Therefore, according to the formulae (3) and (6), the minimum value of the unit cell size a' is $$a'=8.5+2\times 3=14.5[\mu m] \quad (7)$$

As described above, in the production method of the U-MOS shown in FIGS. 16 to 19 and FIG. 15, the reduction limit of the unit cell size a' is about 14.5 μm, which is approximately the same as 15 μm of the conventional DMOS type, and it has been difficult to significantly reduce the ON-resistance per area.

SUMMARY OF INVENTION

It is an object of the present invention to provide a vertical type power MOSFET in which the ON-resistance can be made small.

In order to achieve the above-mentioned object, the production method of a vertical type power MOSFET according to the present invention is different from conventional methods, wherein substantial groove formation is performed beforehand before formation of a base layer and a source layer.

Namely, the production method of a vertical type MOSFET according to the present invention is characterized in that it comprises:

a local oxidation step which includes a step of preparing a semiconductor substrate, a step of forming a semiconductor layer of the first conductive type at one main face side of the semiconductor substrate, the semiconductor layer having an impurity concentration lower than that of the semiconductor substrate and using the surface of the semiconductor layer of the low concentration as a main surface, and a step of local oxidizing a predetermined region of the main surface, thereby a local oxide film having a predetermined depth from the main surface is formed in the semiconductor layer in the predetermined region, an impurity introduction step in which in order to form channels on the semiconductor layer surface contacting with a side face of the local oxide film, impurities of the second conductive type and the first conductive type are doubly diffused from the main surface successively in a manner of self-alignment with respect to the local oxide film, and the length of the channel is determined by the double diffusion, simultaneously with which a base layer of the second conductive type and a source layer of the first conductive type are formed, and remaining semiconductor layer is made into a drain layer of the first conductive type, gate formation step in which the local oxide film is removed after the double diffusion to form a groove structure having the predetermined depth, an inner wall of the groove including a portion to become the channel is oxidized to provide a gate oxide film, and a gate electrode is formed on the gate oxide film, and a source and drain electrodes formation step in which a source electrode which electrically contacts with both the source layer and the base layer, and a drain electrode which electrically contacts with the other main face side of the semiconductor substrate are formed.

Namely, the base layer and the source layer are formed by double diffusion in a manner of self-alignment using the local oxide film as the mask for diffusion, simultaneously with which the channel region is set at the sidewall portion of the semiconductor layer subjected to erosion by the local oxide film. In addition, this local oxide film is removed in the following steps, which becomes the groove portion in which the gate electrode is established.

As described above, the channels are formed at the sidewall portions in the manner of self-alignment by the end face of the local oxide film, so that the channels of the adjacent cells formed at each of the sidewall portions of the grooves have an exactly symmetric structure. In addition, the base layer is diffused in the manner of self-alignment using the local oxide film as the mask, so that the base layer is subjected to the diffusion and formation with exact positional determination at the sidewall portion of the groove, and its conjugation depth can be exactly controlled.

Therefore, it is also possible to set a diffusion condition so as to allow the base layer to exactly wrap the edge portion of the groove bottom face.

As described above, the groove is formed by the local oxidation method, and the local oxide film is used as the mask to form the base layer, the source layer and the channel by the double diffusion in the manner of self-alignment, thereby the edge portion of the groove bottom side can be made into an exactly symmetric structure in each cell.

Therefore, it is unnecessary to form a U-groove having a sufficiently long bottom face to allow the edge portion to be positioned in the base layer even when the positional deviation of the U-groove with respect to the base layer end occurs as in the conventional U-MOS device, and the length of the bottom face of the U-groove can be made short into the necessary minimum. As a result, it is unnecessary to take the mask deviation into account, the unit cell size can be greatly reduced, and the ON-resistance per area can be reduced to be approximately the same as that of the R-MOS device. Moreover, the production yield and the reliability are high in a degree equivalent to the DMOS type.

BRIEF DESCRIPTION OF DRAWINGS

FIG. 1($a$) is a plane view showing a part of a vertical type power MOSFET according to a first embodiment of the present invention, FIG. 1($b$) is a cross-sectional view taken along A—A in FIG. 1($a$);

FIG. 2 through FIG. 13 are cross-sectional views of important parts to be used for the explanation of production steps of the vertical type power MOSFET according to the first embodiment of the present invention;

FIG. 24($a$) is a plane view showing a part of a vertical type power MOSFET according to a fifth embodiment of the present invention, FIG. 24($b$) is a cross-sectional view taken along C—C in FIG. 24($a$); and FIG. 25($a$) is a plane view showing a part of a vertical type power MOSFET according to a sixth embodiment of the present invention, FIG. 25($b$) is a cross-sectional view taken along D—D in FIG. 25($a$).

DESCRIPTION OF PREFERRED EMBODIMENTS

Embodiments of the present invention will be explained hereinafter with reference to the drawings.

Figure 3:
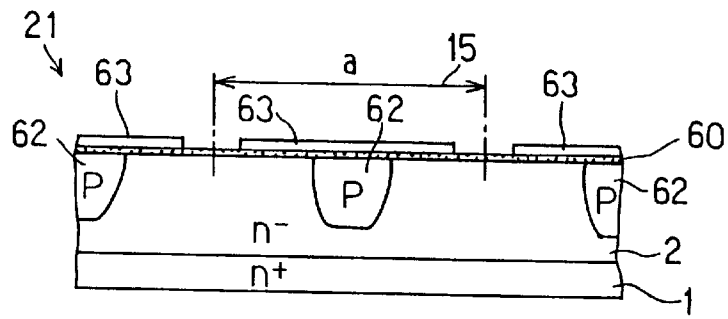
Figure 4:
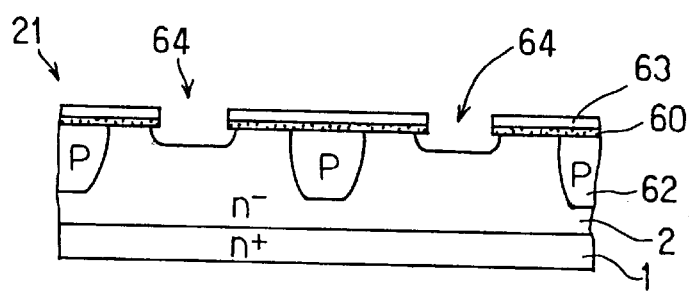
Figure 5:
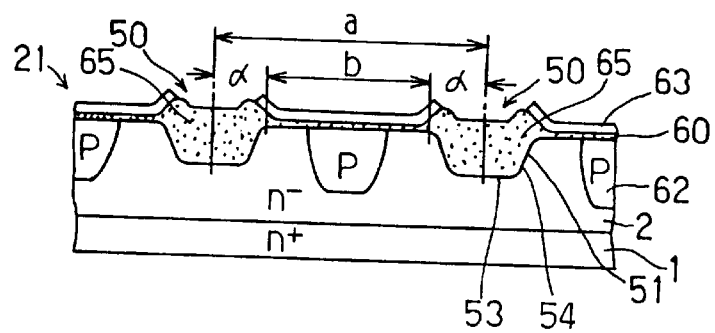
Figure 6:
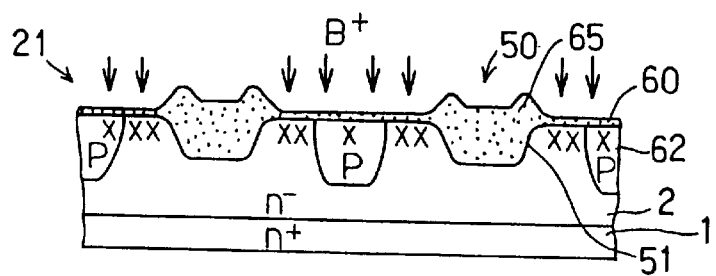
Figure 7:
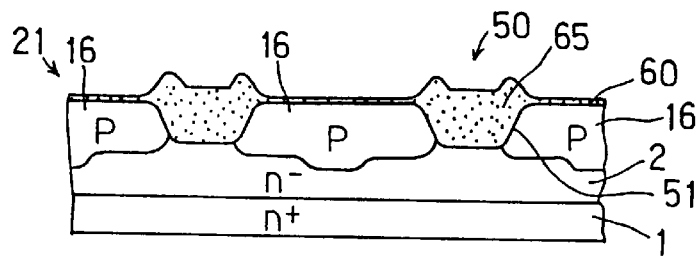
Figure 8:
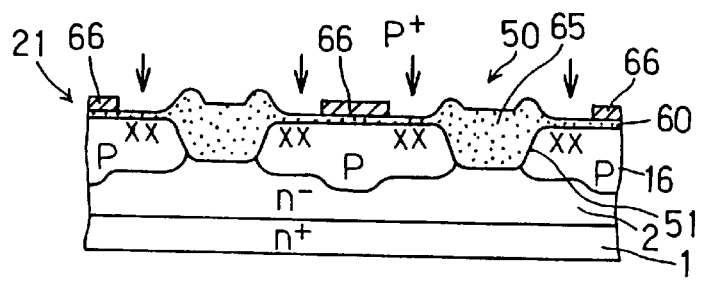
Figure 9:
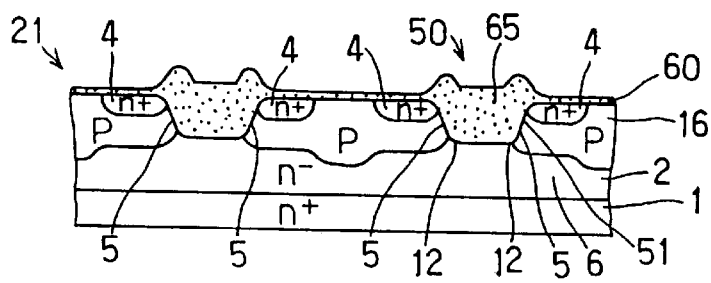
Figure 10:
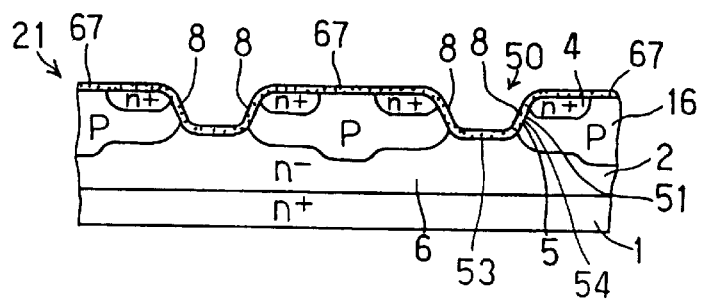
Figure 11:
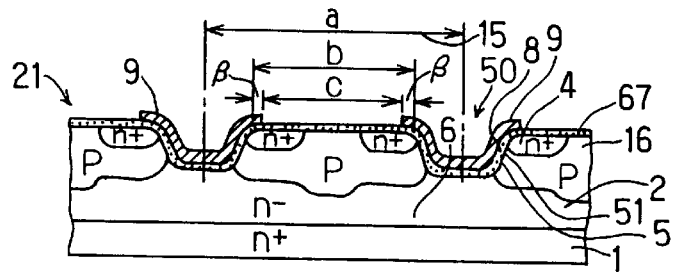
Figure 12:
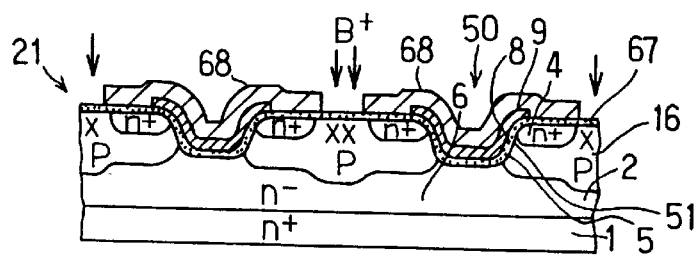
Figure 13:
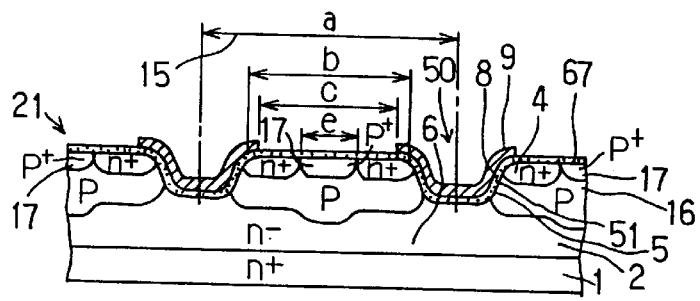

FIG. 1($a$) is a plane view of a vertical power MOSFET comprising rectangular unit cells according to the first embodiment of the present invention, and FIG. 1($b$) is a cross-sectional view taken along A—A in FIG. 1($a$). FIG. 2 to FIG. 13 are also cross-sectional views of a wafer as each step progresses in the production of the vertical type power MOSFET, which corresponds to FIG. 1($b$). Incidentally, FIG. 2 is a cross-sectional view of the wafer subjected to boron ion implantation for the formation of the central portion of a p-type base layer, FIG. 3 is a cross-sectional view of the wafer subjected to patterning of a silicon nitride film at an interval of a unit cell size a for the LOCOS oxidation, FIG. 4 is a cross-sectional view of the wafer subjected to wet etching using a window of the silicon nitride film, FIG. 5 is a cross-sectional view of the wafer in which a LOCOS oxide film is formed, FIG. 6 is a cross-sectional view of the wafer subjected to boron ion implantation for the formation of the p-type base layer using the LOCOS oxide film as a mask, FIG. 7 is a cross-sectional view of the wafer in which the p-type base layer is formed by thermal diffusion, FIG. 8 is a cross-sectional view of the wafer subjected to phosphorus ion implantation for the formation of an $n^+$-type source layer using the LOCOS oxide film as a mask, FIG. 9 is a cross sectional view of the wafer in which the $n^+$-type source layer is formed by thermal diffusion, FIG. 10 is a cross-sectional view of the wafer in which a gate oxide film is formed by thermal oxidation after removing the LOCOS oxide film is formed on the gate oxide film, FIG. 11 is a cross-sectional view of the wafer in which a gate electrode is formed on the gate oxide film, FIG. 12 is a cross-sectional view of the wafer subjected to boron ion implantation for the formation of a $p^+$-type base contact layer, FIG. 13 is a cross-sectional view of the wafer in which the $p^+$-type base contact layer is formed by thermal diffusion, and FIG. 1($b$) is a completed cross-sectional view of the wafer in which an interlayer insulation film, a source electrode and a drain electrode are formed.

The vertical type power MOSFET unit cell portion of this embodiment as shown in FIG. 1($b$) is now described. FIGS. 1($a$) and 1($b$) show a large number of the unit cells 15 which are regularly arranged vertically and laterally on a plane with a pitch width (unit cell size) a.

In FIGS. 1($a$) and 1($b$), a wafer 21 comprises a semiconductor substrate 1 and an $n^-$-type epitaxial layer 2 thereon. The semiconductor substrate 1 is constituted of $n^+$-type having an impurity concentration of about $10^{20}$ $cm^{-3}$ and a thickness of 100 to 300 $\mu$m and the $n^-$-type epitaxial layer 2 has an impurity concentration of about $10^{16}$ $cm^{-3}$ and a thickness of about 7 $\mu$m. The unit cells 15 are constituted on the main surface of this wafer 21. In order to form a U-groove 50 on the main surface of the wafer 21 with a unit cell size a of about 12 $\mu$m, a LOCOS oxide film having a thickness of about 3 $\mu$m is formed, and using this oxide film as a mask, double diffusion in a manner of self-alignment is used to form a p-type base layer 16 having a junction depth of about 3 $\mu$m and an $n^+$-type source layer 4 having a junction depth of about 1 μm, thereby a channel 5 is set at a sidewall portion 51 of the U-groove 50. Incidentally, the junction depth of the p-type base layer 16 is set to be a depth with which no destruction occurs due to breakdown at an edge portion 12 of the bottom side of the U-groove 50. In addition, in order to allow the junction depth of the central portion of the p-type base layer 16 to be deeper than those of surroundings, boron is beforehand diffused at the central portion of the p-type base layer 16, so as to be set to allow the breakdown to occur at the central portion of the bottom face of the p-type base layer 16 when a high voltage is applied between the drain and the source. In addition, after the double diffusion, the diffusion mask and the LOCOS oxide film used for the formation of the U-groove 50 are removed, a gate oxide film 8 having a thickness of about 60 nm is formed at the inner wall of the U-groove 50, and a gate electrode 9 comprising polysilicon having a thickness of about 400 nm and an interlayer insulation film 18 comprising BPSG having a thickness of about 1 μm are formed thereon. Further, at the surface of the central portion of the p-type base layer 16, a p$^+$-type base contact layer 17 having a junction depth of about 0.5 μm is formed, and a source electrode 19 formed on the interlayer insulation film 18 makes ohmic contact with the n$^+$-type source layer 4 and the p$^+$-type base contact layer 17 through the contact hole. In addition, a drain electrode 20 is formed to make ohmic contact with the back face of the semiconductor substrate 1.

Figure 15:
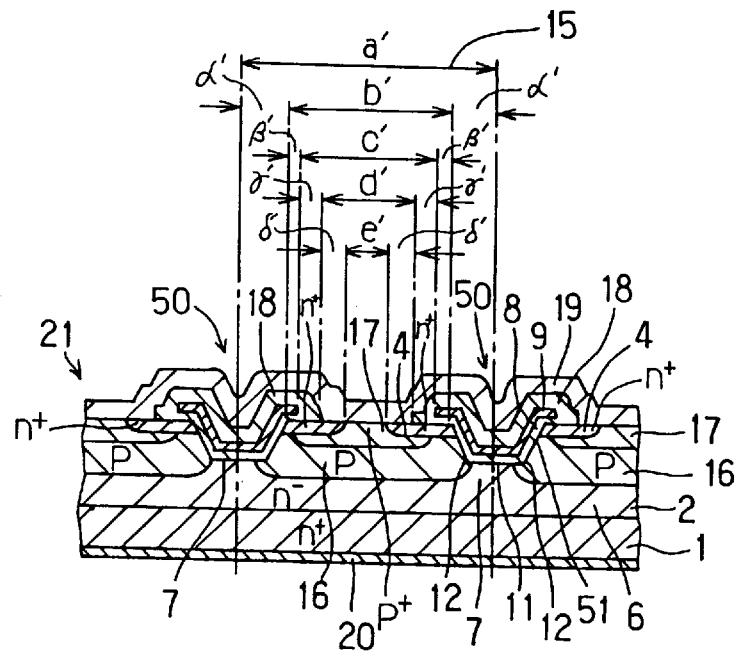
FIG. 15 is a cross-sectional view of a vertical type power MOSFET of the conventional U-MOS type.
Figure 16:
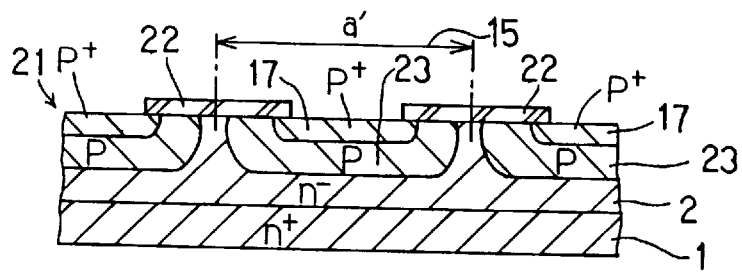
FIG. 16 through FIG. 19 are cross-sectional views of important parts to be used for the explanation of production steps of the vertical type power MOSFET of the conventional U-MOS type.
Figure 17:
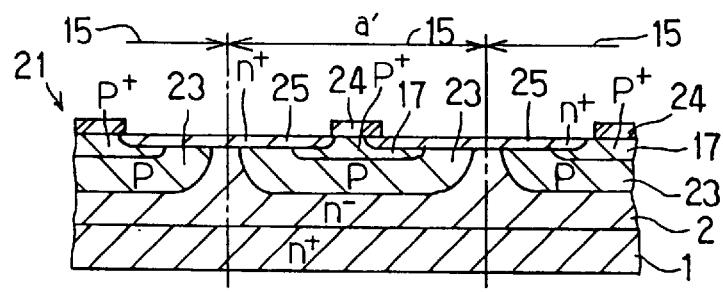
Figure 18:
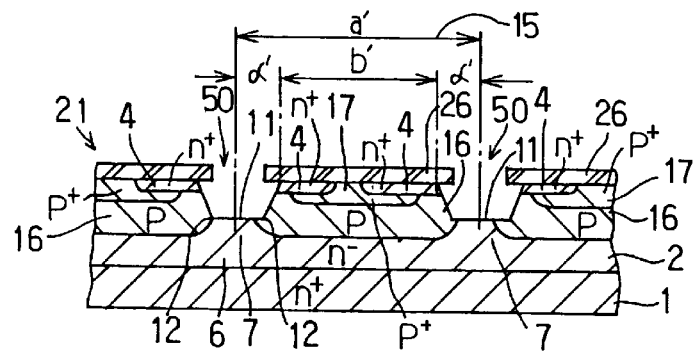
Figure 19:
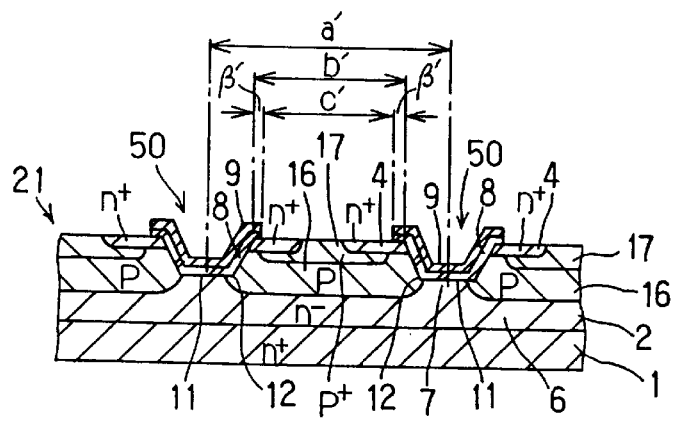

In the vertical type power MOSFET of the present embodiment shown in FIGS. 1(a) and 1(b) and as explained above, the LOCOS oxide film is used as the mask to doubly diffuse the p-type base layer 16 and the n$^+$-source layer 4 by self-alignment, so that it becomes unnecessary to take the adjustment accuracy of the mask into account, and in the above-mentioned formulae (1) to (7) established in the conventional U-MOS device shown in FIG. 15, the length α2' to contact with the p-type base layer 16 of the bottom side portion of the U-groove 50 can be neglected. Therefore, when each of the sizes other than α2' are numerical values as shown in the prior art and are used in the numerical formula 2, then in the present embodiment, according to the formula (7), the plane distance α between the center and the upper end of the U-groove 50 can be reduced from 3 μm up to 1.5 μm.

Figure 14:
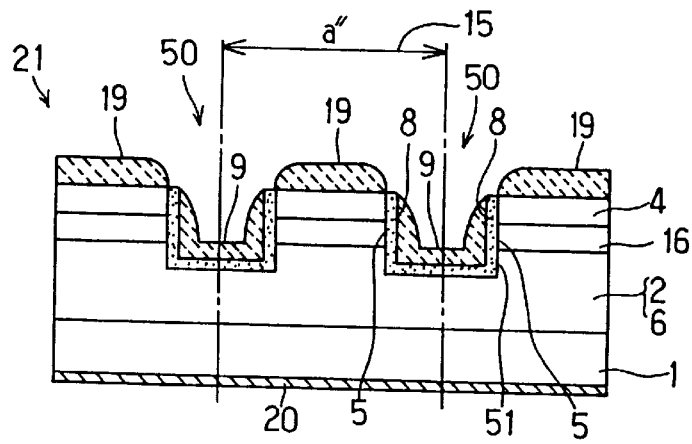
FIG. 14 is a cross-sectional view of a vertical type power MOSFET of the conventional R-MOS type.

As a result, the unit cell size a can be reduced up to 11.5 μm from 14.5 μm of the conventional U-MOS shown in FIG. 15, and the channel width per area can be taken widely, to make it possible to reduce ON-resistance up to a value near the ON-resistance per area of the R-MOS device shown in FIG. 14.

Next, a production method of the vertical type power MOSFET according to the present invention will be explained.

At first, as shown in FIG. 2, a wafer 21, in which an n$^-$-type epitaxial layer 2 is grown on the main surface of a semiconductor substrate 1 comprising n$^+$-type silicon, is prepared. This semiconductor substrate 1 has its impurity concentration of about $10^{20}$ cm$^{-3}$. In addition, the epitaxial layer 2 has its thickness of about 7 μm and its impurity concentration of about $10^{16}$ cm$^{-3}$. The main surface of this wafer 21 is thermally oxidized to form a field oxide film 60 having a thickness of about 60 nm, and then a photoresist film 61 is deposited to perform patterning of the photoresist film 61 into a pattern opening to the central portion of a planned position of cell formation by means of known optical lithography steps. Using this photoresist film 61 as a mask, ion implantation of boron (B$^+$) is performed.

After peeling off the resist, a p-type diffusion layer 62 having a junction depth of about 3 μm is formed by thermal diffusion as shown in FIG. 3. This p-type diffusion layer 62 ultimately becomes a part of a p-type base layer 16 as described hereinafter, and when a high voltage is applied between the drain and the source, the breakdown is allowed to occur stable at the bottom side portion of the p-type diffusion layer 62, thereby an object of the present invention to increase the surge resistance is achieved.

Next, as shown in FIG. 3, a silicon nitride film 63 is deposited on the main surface of the wafer 21 by about 200 nm, and this silicon nitride film 63 is subjected to patterning to form an opening pattern of a lattice shape opening with a pitch width (size of the unit cell 15) a. Incidentally, this opening pattern is subjected to mask adjustment so as to allow the above-mentioned p-type diffusion layer 62 to be positioned at the central portion of its pitch interval.

Next, as shown in FIG. 4, the silicon nitride film 63 is used as a mask to etch the field oxide film 60, subsequently the n$^-$-type epitaxial layer 2 is isotropically etched into a depth of about 1.5 μm to form a groove 64.

Next, as shown in FIG. 5, the silicon nitride film 63 is used as a mask to thermally oxidize the portion of the groove 64. This is an oxidation method well-known as the LOCOS (Local Oxidation of Silicon), and a LOCOS oxide film 65 is formed by this oxidation, simultaneously with which a U-groove 50 is formed on the surface of the n$^-$-type epitaxial layer 2 subjected to erosion by the LOCOS oxide film 65, and the shape of the groove 50 is decided. Namely, the distance b between upper ends of the adjacent U-grooves 50 is determined by a size of the silicon nitride film 63, which becomes slightly shorter due to side face oxidation by the so-called bird's beak. However, this reduction in the size is about 0.5 μm, and it can be controlled with a high accuracy. Incidentally, it is desirable that an inclination angle of the side face of the U-groove 50 with respect to the main surface of the wafer 21 is not less than 45°, which can be controlled by condition setting of the LOCOS oxidation or depth setting of the groove 64 formed prior to the LOCOS oxidation step.

Figure 20:
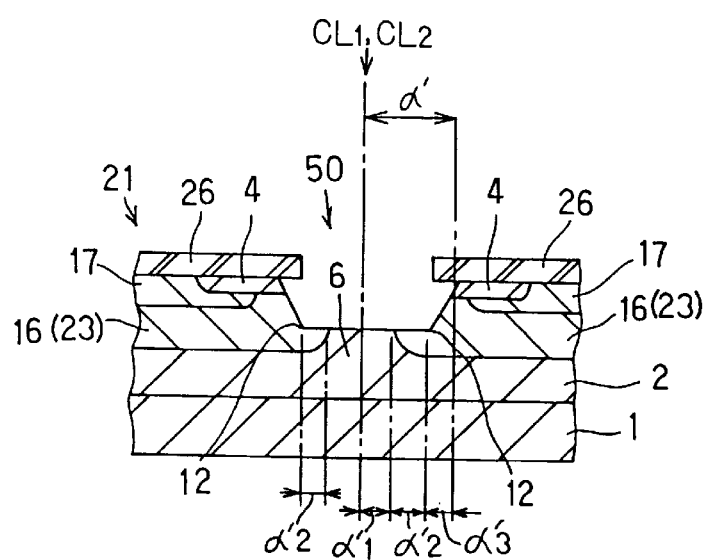
FIG. 20 is a cross-sectional view of an important part showing an ideal state in which the positional relation between an edge portion of a groove bottom face and a p-type base layer is in bilateral symmetry when the groove is formed in the production of the vertical type power MOSFET of the conventional U-MOS type.

As described hereinafter, the distance b between the upper ends of the adjacent U-grooves 50 is about 8.5 μm. In addition, in FIG. 5, the plane distance α between the center and the upper end of the U-groove 50 is given by the formula (8) in the same manner as the case of the conventional U-MOS device shown in FIG. 20 and the formula (4).

$$\alpha = \alpha1 + \alpha2 + \alpha3 \tag{8}$$

However, α1 is ½ of a length to contact with the n$^-$-type drain layer 6 of the bottom side portion of the U-groove 50, α2 is a length to contact with the p-type base layer 16 of the bottom side portion of the U-groove 50, and α3 is a length of projection of the sidewall portion of the U-groove 50 onto the main surface of the wafer 21.

However, α2 in the formula (8) can be omitted as described hereinafter, so that the formula (8) can be rewritten into the following formula.

$$\alpha = \alpha1 + \alpha3 \tag{9}$$

Both α1 and α3 are about 0.75 μm in the processing technique in the present circumstance, so that a takes the following value.

$$\alpha = 1.5[\mu m] \tag{10}$$

Incidentally, the inner wall surface of the U-groove 50 formed by the LOCOS oxidation is flat and has less defects, and the surface has a good surface state in a degree equivalent to the initial main surface of the wafer 21 shown in FIG. 2.

Next, as shown in FIG. 6, the LOCOS oxide film 65 is used as a mask to perform ion implantation of boron through the thin field oxide film 60 for forming the p-type base layer 16. At this time, the boundary portion between the LOCOS oxide film 65 and the field oxide film 60 makes a self-aligned position, and the region to be subjected to the ion implantation is exactly defined.

Next, as shown in FIG. 7, thermal diffusion is performed to give a junction depth of about 3 $\mu$m. Owing to this thermal diffusion, the p-type diffusion layer 62 formed beforehand in the step shown in FIG. 3 is integrated with a diffusion layer of boron implanted in the step shown in FIG. 6, and one p-type base layer 16 is formed. In addition, both end faces of the region of the p-type base layer 16 are defined at the positions of the sidewalls of the U-groove 50 in a manner of self-alignment.

Next, as shown in FIG. 8, using masks of both of the LOCOS oxide film 65 and the photoresist film 66 subjected to patterning with a pattern remaining at the surface central portion of the p-type base layer 16 surrounded by the LOCOS oxide film 65 having been formed on the surface of the wafer 21 in the lattice-shaped pattern, ion implantation of phosphorus through the thin field oxide film 60 is performed for forming the n$^+$-type source layer 4. Also in this case, in the same manner as the case in which boron has been ion-implanted in the step shown in FIG. 6, the boundary portion between the LOCOS oxide film 65 and the field oxide film 60 makes a self-alignment position, and the region to be subjected to the ion implantation is exactly defined.

Next, as shown in FIG. 9, thermal diffusion is performed with a junction depth of 0.5 to 1 $\mu$m, so as to form the n$^+$-type source layer 4 and simultaneously set the channel 5. In this thermal diffusion, the end face of the region of the n$^+$-type source layer 4 to contact with the U-groove 50 is defined at the position of the sidewall of the U-groove 50 in a manner of self-alignment.

Setting of a junction depth of the p-type base layer 16 at the time of completion of this thermal diffusion becomes important. Namely, when a high voltage is applied between the drain and the source of a completed article of the vertical type power MOSFET of the present embodiment, it is important to set the junction depth of the p-type base layer 16 at the value not to be destroyed by the occurrence of breakdown at the edge portion 12 of the bottom face of the U-groove 50. This junction depth can be exactly defined by the thermal diffusion.

Figure 21:
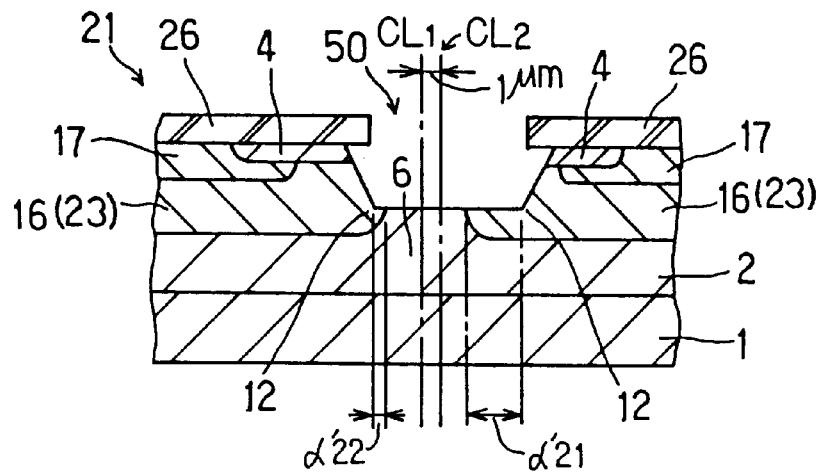
FIG. 21 is a cross-sectional view of an important part showing a practical state in which the positional relation between the edge portion of the groove bottom face and the p-type base layer is not in bilateral symmetry due to mask deviation when the groove is formed in the production of the vertical type power MOSFET of the conventional U-MOS type.

As described above, in accordance with the steps in FIG. 6 to FIG. 9, the junction depth of the p-type base layer 16 and its shape are decided. The important face with respect to the shape of this p-type base layer 16 is that the position of the side face of the p-type base layer 16 is self-aligned with the side face of the U-groove 50 and after that thermally diffused so that the shape of the p-type base layer 16 becomes completely bilaterally symmetrical with respect to the U-groove 50. As a result, the difference between the right and left contact lengths $\alpha'21$ and $\alpha'22$ resulting from the mask deviation of the bottom side portion of the U-groove 50 and the p-type base layer 16, which has occurred in the conventional U-MOS as shown in FIG. 21, always disappears is accordance with the production steps of the present invention, and the following formula is established.

$$\alpha'21 = \alpha'22 \tag{11}$$

Further, the junction depth of the p-type base layer 16 can be exactly determined by condition setting of the thermal diffusion, so that it becomes unnecessary to take the length $\alpha'2$ with which the bottom side portion of the U-groove 50 contacts with the p-type base layer 16 into account. Namely, in the present embodiment, $\alpha 2$ can be omitted in the above-mentioned formula (8), and hence the above-mentioned formula (9) is established.

Next, as shown in FIG. 10, the LOCOS oxide film 65 is removed by wet etching to expose the inner wall 51 of the U-groove 50, and then the gate oxide film 8 having a thickness of about 60 nm is formed by thermal oxidation. As described above, the inner wall 51 of the U-groove 50 is a good silicon surface having good flatness and less defect, so that the film quality of the gate oxide film 8 made by thermally oxidizing this surface, the interface state density of the interface of the channel 5, and the carrier mobility are good in a degree equivalent to the conventional DMOS.

Next, as shown in FIG. 11, a polysilicon film having a thickness of about 400 nm is deposited onto the main surface of the wafer 21, to form a gate electrode 9 in which patterning is made so as to be separated by the distance c being shorter than the distance b between the upper ends of the two adjacent U-grooves 50 by 2$\beta$. Taking the adjustment accuracy of the mask of 0.5 to 1 $\mu$m into account, when $\beta$ is set to be about 1 $\mu$m so as to allow the gate electrode 9 to necessarily terminate at the flat portion of the main surface of the wafer 21, the separation distance c between the two adjacent gate electrodes 9 is 6.5 $\mu$m.

As described above, the steps shown in FIG. 6 to FIG. 11 are the most important parts of the production steps in the present embodiment, wherein the LOCOS oxide film 65 is used as the mask for the double diffusion of the manner of self-alignment, the p-type base layer 16, the n$^+$-source layer 4 and the channel 5 are formed, and then the LOCOS oxide film 65 is removed, after which the gate oxide film 8 and the gate electrode 9 are formed.

Next, as shown in FIG. 12, using the photoresist film 68 subjected to patterning as a mask, boron in ion-implanted through the oxide film 67 for forming a p$^+$-type base contact layer 17.

Next, as shown in FIG. 13, thermal diffusion is performed with a junction depth of about 0.5 $\mu$m, and the p$^+$-type base contact layer 17 is formed. In this thermal diffusion, the size e of the exposure of the p$^+$-type base contact layer 17 to the surface is about 1.5 $\mu$m, which is determined by a pattern size of the photoresist film 68.

As shown in FIG. 1(b), an interlayer insulation film 18 comprising BPSG is formed on the main surface of the wafer 21, a part of which is subjected to a contact hole opening so as to expose the p$^+$-type base contact layer 17 and the n$^+$-source layer 4. Further, a source electrode 19 comprising an aluminum film is formed, so as to make ohmic contact between the p$^+$-type base contact layer 17 and the n$^+$-source layer 4 through the above-mentioned contact hole. Further, for protection of the aluminum film, a passivation film (not shown in the figure) comprising silicon nitride or the like is formed by the plasma CVD method or the like, and a drain electrode 20 comprising three-layer film of Ti/Ni/Au is formed on the back face of the wafer 21, so as to make ohmic contact with the n$^+$-type semiconductor substrate 1.

As described above, in the structure and the production method of the vertical type power MOSFET according to the present embodiment explained using FIG. 2 to FIG. 13 and FIGS. 1(a) and 1(b), the following effects are provided.

(1) As compared with the conventional U-MOS device shown in FIG. 15, a different factor among the conditions for determining the unit cell size a given by the formula (1) to the formula (7) is $\alpha$ shown by the formula (9) and the formula (10), which can be reduced into 1.5 $\mu$m from conventional 3 μm. As a result, according to the formula (3), the unit cell size a can be reduced from conventional 14.5 μm up to a value given by the following formula (12), and it is possible to allow the ON-resistance per area to further approach that of the R-MOS device.

$$a=8.5+2\times 1.5=11.5[\mu m] \quad (12)$$

(2) The silicon surface on which the channel portion is formed is the silicon surface made by removing the oxide film formed by the LOCOS oxidation method by means of the wet etching, wherein the flatness of the surface is good, and there is no defect at all. Therefore, in relation to the film quality of the gate oxide film made by thermally oxidizing this surface, the problems of the insulation inferiority, the decrease in the mobility due to defects of the interface of the channel portion, the change in the threshold voltage and the like are small in a degree equivalent to the conventional DMOS type. As a result, the yield is high and the reliability is high.

(3) Methods in which delicate management is required in production steps as represented by the reactive ion etching in the R-MOS device are not used, but the LOCOS oxidation method, in which management of production is extremely easy and the size accuracy and the reproducibility are good, is used, so that the throughput and the yield in the production steps are high, and the production cost is cheap.

As described above, the present invention has been concretely explained on the basis of the above-mentioned first embodiment, however, it is needless to say that the present invention is not limited to the above-mentioned embodiment, which can be variously changed within a range without deviating from the gist thereof.

Figure 22:
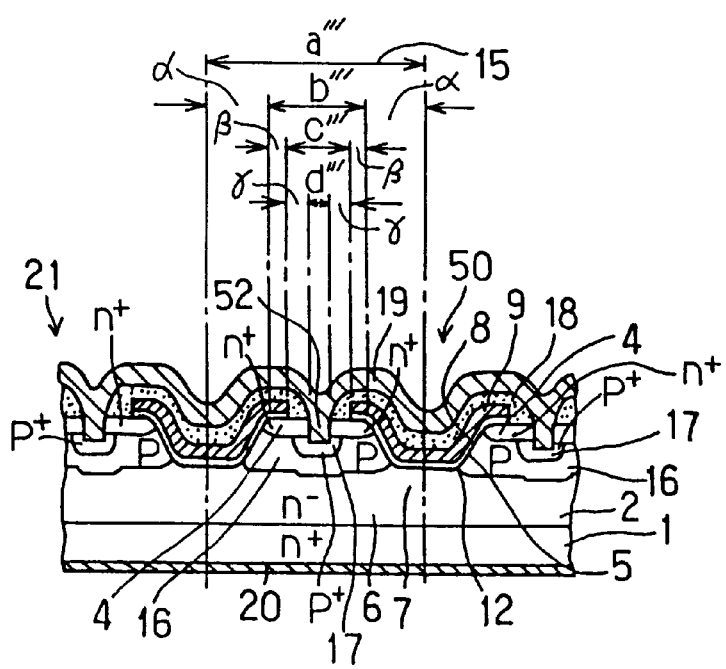
FIG. 22 is a cross-sectional view of an important part of a vertical type power MOSFET according to a second embodiment of the present invention.

For example, in the second embodiment shown in FIG. 22, a source electrode 19 is allowed to make ohmic contact with an n⁺-type source layer 4 and a p⁺-type base contact layer 17 through a groove 52, and especially there is given a structure in which the source electrode 19 makes ohmic contact with the side face of the n⁺-type source layer 4. In order to fabricate this structure, in the production steps shown in FIG. 2 to FIG. 13, the n⁺-source layer 4 is diffused and formed on the whole face of the upper face of the p-type base layer 16 to constitute the gate structure, and further when the contact hole is opened through the interlayer insulation film 18, a groove 52 may be formed penetrating through the interlayer insulation film 18 and the n⁺-type source layer 4 to arrive at the p⁺-type base contact layer 17. Incidentally, setting can be made variously such that the p⁺-type base contact layer 17 is formed before the formation of the n⁺-type source layer 4, is formed by performing ion implantation of boron with increasing the acceleration voltage after the formation of the n⁺-type source layer 4, and is formed simultaneously with the n⁺-type source layer 4 by thermal diffusion using ion implantation of boron before thermal diffusion for the formation of the n⁺-type source layer or the like.

According to this structure, it becomes unnecessary to take the plane distance δ between the end of the contact hole and the end of the portion of exposure of the base contact layer 17 to the surface into account in FIG. 1(b). Further, it is unnecessary to especially define the size e of the portion of exposure of the base contact layer 17 to the surface, and when the contact hole having a size of d is opened, the base contact layer 17 can be simultaneously exposed. Namely, according to the structure and the production method of the present second embodiment, a part of the formula (1) to the formula (3) in relation to the conventional U-MOS device is changed as follows.

$$d'''=1.5[\mu m]$$
$$c'''=4.5[\mu m]$$
$$b'''=6.5[\mu m] \quad (13)$$
$$a'''=b'''+2\alpha$$

Therefore, according to the formula (13) and the formula (10), the unit cell size of the vertical type power MOSFET can be made small into not more than 10 μm as $$a'''=6.5+2\times 1.5=9.5[\mu m] \quad (14)$$

the cell size equivalent to the conventional R-MOS becomes possible, and a remarkable reduction in the ON-resistance can be achieved. Moreover, in the same manner as the first embodiment, the vertical type power MOSFET in which the yield and the reliability are high is obtained.

Next, the third embodiment of the present invention will be explained. In the following explanation, referring to the production method of the vertical type power MOSFET according to the first embodiment of the present invention and its structural figures shown in FIGS. 1(a), 1(b) to FIG. 13, explanation made herein is limited to portions in which the present third embodiment is different from the above-mentioned first embodiment or portions which are newly set in the third embodiment, and since the other portions are the same as those of the above-mentioned first embodiment, their explanation will be omitted.

In the third embodiment, in FIG. 2, the wafer 21 is selected to have the index of plane of its main surface which is (1 1 1) or those near it. Thus the surface of the n⁻-type epitaxial layer 2 corresponding to the bottom face of the LOCOS oxide film 65 formed on the wafer 21 in the step shown in FIG. 5, that is the bottom face 53 of the U-groove 50 is parallel to the main surface, so that its index of plane is also (1 1 1).

In addition, in FIG. 1(a), owing to the optimization of the surface directions of the sides of the rectangular unit cell 15 with respect to the surface direction of the main surface of the wafer 21, and the optimization of the inclination angle of the side face 54 of the U-groove 50 by condition setting in the LOCOS oxidation step shown in FIG. 5, the index of plane of the side face 54 of the U-groove 50 is set to be an index near (1 0 0) in which the interface state density is less.

Thus in the step for forming the gate oxide film 8 shown in FIG. 10, depending on the difference in the index of plane between the bottom face 53 (the index of plane is (1 1 1) as described above) of the U-groove 50 and the side face 54 (the index of plane is an index near (1 0 0) as described above), a step condition is selected in which the oxidation velocity is faster at the bottom face 53. Namely, a relatively rapid oxidation time in which the oxidation of silicon is controlled by rate-determination of reaction and a thin oxide film are necessary conditions, wherein the thin gate oxide film formation of about 60 nm satisfies the conditions. According to the conditions, the thickness $t_B$ of the gate oxide film formed on the surface of the bottom face 53 of the U-groove 50 becomes thicker than the thickness $t_S$ of the gate oxide film formed on the surface of the side face 54 of the U-groove 50. Namely, there is given $$t_S<t_B \quad (15)$$

for example, following numerical values are obtained as $t_S$ and $t_B$.

$$t_S=60[nm], t_B=80[nm] \quad (16)$$

Next, the function will be explained in which the third embodiment is superior to the first embodiment owing to its modification of its structure.

In the third embodiment, as shown in the formulae (15) and (16), the thickness $t_B$ of the gate oxide film formed on the surface of the bottom face 53 of the U-groove 50 in FIGS. 1(a), 1(b) can be made thicker than the thickness $t_S$ of the gate oxide film formed on the surface of the side face 54 of the U-groove 50. Thus, even when a high voltage is applied between the drain electrode 20 and the source electrode 19, the electric field in the gate oxide film formed at the surface of the bottom face 53 of the U-groove 50 can be reduced, and the dielectric breakdown of the gate oxide film can be prevented. In addition, the gate input capacity of the bottom face portion of the U-groove 50 constituted by the bottom face 53 of the U-groove 50, the gate oxide film formed on its surface and the gate electrode 9 decreases in inverse proportion to the thickness of the gate oxide film, so that high-speed switching becomes possible.

In addition, in the third embodiment, the index of plane of the side face 54 of the U-groove 50 is set to be an index near (1 0 0) in which the interface state density is less so as to provide a low interface state density of the channel portion 5, so that the stability of the threshold voltage is good, the mobility of the channel portion is not decreased, and the resistance to the hot carrier is also strong, so that the long-term reliability in electric characteristics of the vertical type power MOSFET can be maintained.

Figure 23:
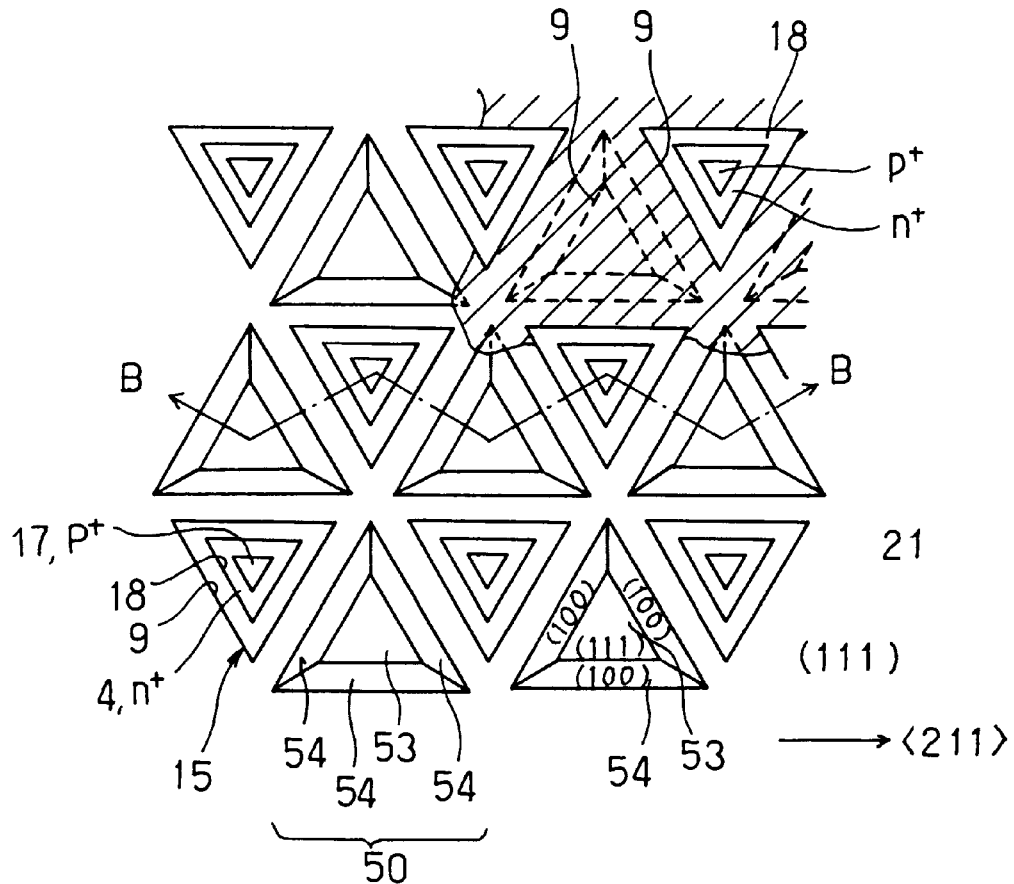
FIG. 23($a$) is an illustrative plane view showing a part of a vertical type power MOSFET according to a fourth embodiment of the present invention, and FIG. 23($b$) is a cross-sectional view taken along B—B in FIG. 23($a$)
Figure 23:
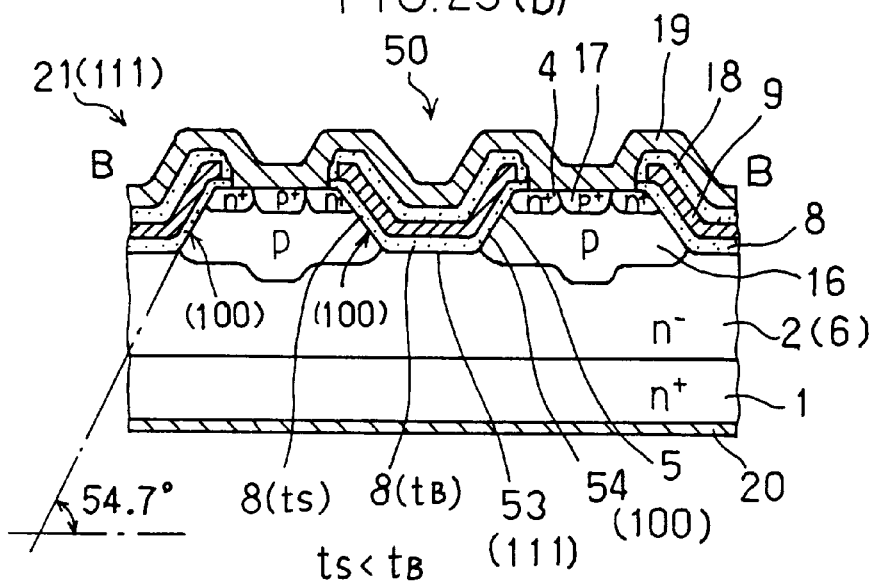

As described above, in the third embodiment, since the explanation has been made only for the case of the rectangular unit cell shown in FIG. 1(a), it was impossible to set index of planes of all of the side faces 54 of the U-groove 50 to be the (1 0 0) plane. The cause thereof is due to the fact that plane (1 1 1) lies in three-times axial symmetry because of its crystal structure, which did not match the rectangular unit cell with no three-times axial symmetry. The fourth embodiment in which this has been improved is shown in FIGS. 23(a) and 23(b). Incidentally, FIG. 23(a) is an illustrative plane view showing a part of a vertical type power MOSFET according to the fourth embodiment of the present invention, wherein the surface pattern of a gate electrode 9 is given by indication of a part only (the hatched area in the figure) in order to see the figure more easily, and indication of a source electrode 19 is omitted. In addition, FIG. 23(b) is a cross-sectional view taken along B—B in FIG. 23(a). In the figure, the same constitution as that in FIG. 1(b) is designated by the same symbol.

In the fourth embodiment, as shown in FIG. 23(a), a pattern of a triangular unit cell 15 and a U-groove 50 of a triangular pattern are used, and a face direction of one side of the triangle is set to be <2 1 1>, and further as shown in FIG. 23(b), in order to provide an angle of 54.7° formed by the main surface of a wafer 21 and a side face 54 of the U-groove 50, the conditions in the LOCOS oxidation step shown in FIG. 5 are set. By doing so, index of planes of all of the side faces 54 of the U-groove 50 can be made (1 0 0) in which the interface state is the smallest, and it is possible to form channels having good characteristics equivalent to those of DMOSFET of the conventional planar type.

FIG. 24(a) is a plane view of a vertical power MOSFET comprising rectangular unit cells 15 according to the fifth embodiment of the present invention, and FIG. 24(b) is a cross-sectional view taken along C—C in FIG. 24(a). In the figure, the same constitution as that in FIGS. 1(a) and 1(b) is designated by the same symbol. In the following explanation, referring to the production method of the vertical type power MOSFET according to the first embodiment, explanation made herein is limited to portions in which the present fifth embodiment is different from the first embodiment or portions which are newly set in the fifth embodiment, and since the other portions are the substantially same as those of the first embodiment, their explanation will be omitted.

In the fifth embodiment, as shown in FIGS. 24(a) and 24(b), the wafer 21 is selected to have the index of plane of its main surface which is (1 0 0) or those near it. Thus the surface of the n⁻-type epitaxial layer 2 corresponding to the bottom face of the LOCOS oxide film 65 formed on the wafer 21 in the corresponding step shown in FIG. 5, that is the bottom face 53 of the U-groove 50, is parallel to the main surface, so that its index of plane is also (1 0 0).

In addition, as shown in FIG. 24(a), owing to the optimization of the directions of the sides of the rectangular unit cell 15 with respect to the plane orientation of the main surface of the wafer 21, and the optimization of the inclination angle of the side face 54 of the U-groove 50 by condition setting in the LOCOS oxidation step shown in FIG. 5, the index of plane of the side face 54 of the U-groove 50 is set to be an index of approximately (1 1 1). That is, the index of plane of the side surface 54 of the U-groove 50 after removing the LOCOS oxide film 65 is also approximately (1 1 1).

In other words, in the fifth embodiment, as shown in FIG. 24(a), a pattern of a rectangular unit cell 15 and a U-groove 50 of a lattice-like pattern are used, and a face direction of one side of the rectangle or the lattice is set to be <0 1 1>, and further as shown in FIG. 24(b), in order to provide an angle of 54.7° formed by the main surface of a wafer 21 and a side face 54 of the U-groove 50, the conditions in the LOCOS oxidation step shown in FIG. 5 are set. By doing so, index of planes of all of the side faces 54 of the U-groove 50 can be made (1 1 1).

More specifically, in the above fifth embodiment, the surface of the silicon substrate 1 with an index of plane of (1 0 0) is used, the conditions of etching (FIG. 4) and LOCOS oxidation (FIG. 5) are selected by using the silicon nitride film 63 patterned at a roughly right angle or in roughly parallel to an direction of <0 1 1> on the surface of the silicon substrate 1, and an angle of the side surface 54 of the U-groove 50 to the surface of the substrate 1 is exactly controlled to be 54.7° as shown in FIG. 24(b). By doing so, all of the side surfaces 54 of the U-groove 50 are made to be in an equivalent crystal surface with an index of plane of (1 1 1). As a result, the side surface 54 of the U-groove 50 can be made to be crystal surface, the channel mobility can be made high and the ON-resistance can be reduced.

Furthermore, the plane orientation of the silicon substrate 1 and the patterning shape may be selected so that the index of plane of side surface 54 of the U-groove 50 can be (1 1 0 as shown in FIGS. 25(a) and 25(b). FIG. 25(a) is a plane view of a vertical power MOSFET comprising rectangular unit cells 15 according to the sixth embodiment of the present invention, and FIG. 25(b) is a cross-sectional view taken along D—D in FIG. 25(a).

In the sixth embodiment, as shown in FIG. 25(a), a pattern of a rectangular unit cell 15 and a U-groove 50 of a lattice-like pattern are used, and a face direction of one side of the rectangle or the lattice is set to be <0 0 1>, and further as shown in FIG. 25(b), in order to provide an angle of 45.0° formed by the main surface of a wafer 21 and a side face 54 of the U-groove 50, the conditions in the LOCOS oxidation step shown in FIG. 5 are set. By doing so, index of planes of all of the side faces 54 of the U-groove 50 can be made (1 1 0).

Now, a manufacturing method for a semiconductor device which makes the plane orientation of the side surface 54 of the U-groove 50 to be a (1 1 0) plane will be described only as to those parts which are different from the fifth embodiment.

In the silicon nitride film patterning process illustrated in FIG. 3, the silicon nitride film 63 is patterned to have an open pattern which is perpendicular and parallel to an orientation of <0 0 1> in its surface pattern. By using this silicon nitride film 63 as a mask, the etching for forming groove 64 (FIG. 4) and the LOCOS oxidation (FIG. 5) are performed. In these processes, the conditions of etching and LOCOS oxidation are selected so as to control an angle, which is an angle of the side surface 54 of the U-groove 50 to the surface of the substrate 1, so that the index of plane of the channel formation part on the side surface 54 of the U-groove 50 is set to be (1 1 0).

The effect of this sixth embodiment will be described. Like the fifth embodiment, all of the side surfaces 54 of the U-groove 50 are made a crystal surface with the (1 1 0) plane having a high channel mobility, and therefore the channel mobility can be increased and the ON-resistance can be reduced.

That is, when the silicon substrate 1 with an index of plane of (1 0 0) is used, the conditions of the etching and LOCOS oxidation is selected by using the silicon nitride film 63 patterned at a roughly right angle or roughly parallel to a direction of <0 0 1> on the surface of the silicon substrate 1 and an angle of the side surface 54 of the U-groove 50 to the surface of the silicon substrate 1 is controlled to be 45.0° as shown in FIG. 25(b), all of the side surfaces 54 of the U-groove 50 can be made to be in an equivalent crystal surface having the index of plane of (1 1 0). As a result, the side surface 54 can be made to be a crystal surface and the channel mobility can be increased, whereby the ON-resistance can be reduced.

In the above fifth and sixth embodiments, the silicon substrate 1 with an index of plane of (1 0 0) is used and the silicon nitride film 63 patterned at a right angle and parallel to an orientation <0 1 1> or <0 0 1> of the surface of the silicon substrate 1. However, even if this condition is deviated from the above, as long as the channel mobility on the four surfaces, i.e., all side surfaces 54, of the U-groove 50 can be improved and the an interfacial level can be formed with a high symmetry, this case can be included in the present invention.

Also, in the above fifth and sixth embodiments, the lattice-like pattern is used for silicon nitride film patterning at a right angle and parallel to an orientation of <0 1 1> or <0 0 1>. However, it is not limited to the lattice-like pattern but a stripe-like pattern may also be used and the patterning may be at either a right angle or parallel to an orientation of <0 1 1> or <0 0 1>.

According to the above-mentioned fourth, fifth and sixth embodiments, all of the side faces 54 of the U-groove 50 can be made to have the same crystal orientation, and therefore, when channels are formed on the respective surfaces 54 of the U-groove 50, currents flowing therethrough can be made uniform and local concentration of current can be prevented. Therefore, a vertical type power MOSFET with high reliability can be obtained.

As described above, in the various embodiments explained, the explanation has been made only for the case in which the present invention is applied to the vertical type power MOSFET which performs the unipolar operation, however, there is no limitation thereto, and the application may be available to a power MOSIC in which such a vertical type power MOSFET is incorporated, and further the application is also possible to a gate structure of an insulation gate type bipolar transistor (IGBT) which performs the bipolar operation.

In addition, the explanation has been made only for the n-channel type in the embodiments, however, it is needless to say that the same effect can be obtained with respect to the p-channel type in which the type of the semiconductor is exchanged between the n-type and the p-type.

Further, the plane shape of the unit cell is not limited to the above-mentioned square and the equilateral triangle, and alternatively it is possible to optionally select rectangles, hexagons and the like. Incidentally, with respect to the change of the plane pattern, the change can be easily made using the formation pattern of the LOCOS oxide film 65.

INDUSTRIAL APPLICABILITY

As described above, in the vertical type MOSFET according to the present invention, it is unnecessary to form a U-groove having a sufficiently long bottom face taking the positional deviation of the U-groove with respect to the base layer end into account as in the conventional U-MOS device, but the length of the bottom face of the U-groove can be made minimally short. As a result, the unit cell size can be greatly reduced, the ON-resistance per area can be reduced into a degree equivalent to the R-MOS device, and the production yield and the reliability are high in a degree equivalent to the DMOS type device, so that it is extremely effective in adoption as switching devices for electric power and the like as MOSIC in which its elemental article or the device is incorporated.

What is claimed is:

1. A production method of a vertical type MOSFET comprising steps of:

preparing a semiconductor substrate;

forming a semiconductor layer of a first conductivity type at one main face side of said semiconductor substrate, said semiconductor layer having an impurity concentration lower than that of said semiconductor substrate and having a main surface oriented in a first crystal orientation;

local oxidizing a region of said main surface of said semiconductor layer to form a local oxide film eroding said main surface of said semiconductor layer by a depth in said region, wherein a condition of said step of local oxidizing is adjusted such that said local oxide film contacts inclined surfaces of said semiconductor layer by side surfaces thereof and all of said inclined surfaces contacting said side surfaces of said local oxide film are oriented in the same crystal orientation of a second crystal orientation;

forming channels on said respective inclined surfaces of said semiconductor layer each contacting said side surface of said local oxide film by doubly-diffusing impurities of a second conductivity type and the first conductivity type from said main surface successively in a manner of self-alignment with respect to said local oxide film, whereby a length of each of said channels is determined by the double diffusion and a base layer of the second conductivity type and a source layer of the first conductivity type are formed with respect to each of said inclined surfaces of said semiconductor layer;

removing said local oxide film after the double diffusion to form a groove structure having said depth, whereby said inclined surfaces each oriented in said second crystal orientation is exposed in an inner wall of said groove structure;

oxidizing said inner wall of said groove structure including a portion to become said channel to provide a gate oxide film;

forming a gate electrode on said gate oxide film;

forming a source electrode electrically connecting to both said source layer and said base layer; and forming a drain electrode electrically connecting to another main face side of said semiconductor substrate.

2. A production method of a vertical type MOSFET according to claim 1, wherein said step of forming a semiconductor layer includes forming a silicon layer, said first crystal orientation of which is (1 1 1).

3. A production method of a vertical type MOSFET according to claim 2, wherein said step of local oxidizing includes adjusting said condition such that said second crystal orientation is (1 0 0).

4. A production method of a vertical type MOSFET according to claim 3, wherein said step of local oxidizing includes making a surface pattern shape of said local oxide film an equilateral triangle shape such that one side of said equilateral triangle shape is along a <2 1 1> crystal axis.

5. A production method of a vertical type MOSFET according to claim 1, wherein said step of local oxidizing includes steps of:

forming an oxidation resistant mask on said main surface of said semiconductor layer;

patterning said oxidation resistant mask to have an opening pattern, an opening side of which is set to be along a particular crystal axis in association with said opening pattern; and oxidizing an exposed surface of said semiconductor layer to form said local oxide film having a shape corresponding to said opening pattern of said oxidation resistant mask, whereby said exposed surface is eroded by said local oxide film and said inclined surfaces each oriented in said second crystal orientation are formed.

6. A production method of a vertical type MOSFET according to claim 5, wherein said local oxide film has said side surfaces which makes said inclined surfaces of said semiconductor layer inclined at a particular angle with respect to said main surface of said semiconductor layer.

7. A production method of a vertical type MOSFET according to claim 6, wherein said step of forming a semiconductor layer includes forming a silicon layer, said first crystal orientation of which is (1 1 1).

8. A production method of a vertical type MOSFET according to claim 7, wherein said opening side of said opening pattern of said oxidation resistant mask is set to be along said particular crystal axis of <2 1 1>, and said particular angle of said inclined surface of said semiconductor layer to said main surface of said semiconductor layer is controlled to be 54.7°, thereby adjusting said second crystal orientation to (1 0 0).

9. A production method of a vertical type MOSFET according to claim 1, wherein said step of local oxidizing includes steps of:

forming an oxidation resistant mask on said main surface of said semiconductor layer;

patterning said oxidation resistant mask to have an opening pattern, an opening side of which is set to be along a particular crystal axis in association with said opening pattern;

etching said semiconductor layer to form an initial groove in said main surface of said semiconductor layer using said patterned oxidation resistant mask as a mask; and oxidizing an etched surface of said semiconductor layer to form said local oxide film having a shape corresponding to said opening pattern of said oxidation resistant mask, whereby said etched surface is eroded by said local oxide film and said inclined surfaces each oriented in said second crystal orientation are formed.

10. A production method of a vertical type MOSFET according to claim 9, wherein said local oxide film has said side surfaces which makes said inclined surfaces of said semiconductor layer inclined at a particular angle with respect to said main surface of said semiconductor layer.

11. A production method of a vertical type MOSFET according to claim 10, wherein said step of forming a semiconductor layer includes forming a silicon layer, said first crystal orientation of which is (1 1 1).

12. A production method of a vertical type MOSFET according to claim 11, wherein said opening side of said opening pattern of said oxidation resistant mask is set to be along said particular crystal axis of <2 1 1>, and said particular angle of said inclined surface of said semiconductor layer to said main surface of said semiconductor layer is controlled to be 54.7°, thereby adjusting said second crystal orientation to (1 0 0).

13. A production method of a vertical type MOSFET according to claim 1, wherein said step of local oxidizing includes adjusting said condition, said adjusting said condition including:

optimizing a surface pattern shape of said local oxide film in correspondence with said first crystal orientation;

determining a direction of a side of said surface pattern shape of said local oxide film with respect to said first crystal orientation of said main surface of said semiconductor layer; and optimizing an inclination angle of said side surface of said local oxide film with respect to said main surface of said semiconductor layer.

14. A production method of a vertical type MOSFET according to claim 13, further comprising a step of etching said semiconductor layer to form an initial groove in said main surface of said semiconductor layer prior to said step of local oxidizing.

15. A production method of a vertical type MOSFET comprising steps of:

preparing a semiconductor substrate having a first concentration of an impurity;

forming a semiconductor layer on a first face of said semiconductor substrate, said semiconductor layer having a surface oriented in a (1 1 1) crystal plane, having a first conductivity type, and having a second concentration of an impurity lower than said first concentration of an impurity;

forming a local oxide film on a region of said semiconductor layer, said local oxide film eroding said semiconductor layer at said region and contacting said semiconductor layer at a plurality of surfaces each oriented in a (1 0 0) crystal plane;

forming a base layer by diffusing impurities of a second conductivity type in said semiconductor layer in a manner of self-alignment with respect to said local oxide film;

forming a source layer by diffusing impurities of said first conductivity type in said semiconductor layer in a manner of self-alignment with respect to said local oxide film;

forming a groove structure including a channel by removing said local oxide film;

forming a gate oxide film by oxidizing an inner wall of said groove;

forming a gate electrode on said gate oxide film;

forming a source electrode in electrical contact with said source layer and said base layer; and forming a drain electrode in electrical contact with a second face of said semiconductor substrate.

16. A production method of a vertical type MOSFET according to claim 15, wherein said step of preparing said semiconductor substrate includes selecting said semiconductor substrate of said first conductivity type.

17. A production method of a vertical type MOSFET according to claim 15, further comprising a step of etching said semiconductor layer to form an initial groove in said surface of said semiconductor layer prior to said step of forming said local oxide film.

18. A production method of a vertical type MOSFET according to claim 15, wherein said step of forming a local oxide film includes making a surface pattern shape of said local oxide film an equilateral triangle shape such that one side of said equilateral triangle shape is along a <2 1 1> crystal axis.

19. A production method of a vertical type MOSFET comprising steps of:

forming a mask having an opening part within a region on a main surface of a first conductivity type semiconductor layer disposed on a semiconductor substrate;

forming on said semiconductor layer a first groove having an inlet part wider than said opening part of said mask, a bottom part roughly parallel to said main surface of said semiconductor layer and a plurality of side parts connecting to said inlet part and said bottom part by applying etching to said semiconductor layer through said opening part of said mask;

forming a local oxide film to a specified thickness from said main surface within said semiconductor layer within said region by local oxidizing a region including said first groove, whereby a plurality of inclined surfaces of said semiconductor layer contacting side surfaces of said local oxide film are formed so as to be in correspondence with said plurality of side parts of said first groove and all of said inclined surfaces of said semiconductor layer are oriented in the same crystal orientation;

forming a second conductivity type base layer within said semiconductor layer by introducing second conductivity type impurities from said main surface so as to include said inclined surfaces of said semiconductor layer, forming a first conductivity type source layer within said base layer by introducing first conductivity type impurities from said main surface, whereby channel regions are defined on said respective inclined surfaces;

forming a second groove to a depth which is deeper than a depth of said first groove by removing said local oxide film; and forming a gate electrode at least on a side surface of said second groove corresponding to each of said inclined surfaces between said source layer and said semiconductor layer with a gate insulating film interposed therebetween, forming a source electrode electrically connecting to said source layer and said base layer and forming a drain electrode electrically connecting to said semiconductor substrate.

20. A production method of a vertical type MOSFET according to claim 19, wherein an index of plane of said main surface of said semiconductor layer is set to (1 0 0), and said step of forming a mask includes forming said mask patterned to have said opening part extending at least along a <0 1 1> crystal axis of said semiconductor layer.

21. A production method of a vertical type MOSFET according to claim 20, wherein said step of forming a second groove includes adjusting an index of plane of said side surface of said second groove to (1 1 1).

22. A production method of a vertical type MOSFET according to claim 20, wherein said mask is patterned such that said opening part includes a first opening part extending along said <0 1 1> crystal axis and a second opening part extending along a direction perpendicular to said <0 1 1> crystal axis.

23. A production method of a vertical type MOSFET according to claim 22, wherein said step of forming a second groove includes adjusting an index of plane of said side surface of said second groove to (1 1 1).

24. A production method of a vertical type MOSFET according to claim 19, wherein an index of plane of said main surface of said semiconductor layer is set to (1 0 0), and said step of forming a mask includes forming said mask patterned to have said opening part extending at least along a <0 0 1> crystal axis of said semiconductor layer.

25. A production method of a vertical type MOSFET according to claim 24, wherein said step of forming a second groove includes adjusting an index of plane of said side surface of said second groove to (1 1 0).

26. A production method of a vertical type MOSFET according to claim 24, wherein said mask is patterned such that said opening part includes a first opening part extending along said <0 0 1> crystal axis and a second opening part extending along a direction perpendicular to said <0 0 1> crystal axis.

27. A production method of a vertical type MOSFET according to claim 26, wherein said step of forming a second groove includes adjusting an index of plane of said side surface of said second groove to (1 1 0).

* * * * *